(12) United States Patent
Schofield et al.

(10) Patent No.: US 7,898,719 B2
(45) Date of Patent: Mar. 1, 2011

(54) REARVIEW MIRROR ASSEMBLY FOR VEHICLE

(75) Inventors: Kenneth Schofield, Holland, MI (US); David C. Wight, Goodrich, MI (US); Mark E. Kramer, Zeeland, MI (US)

(73) Assignee: Donnelly Corporation, Holland, MI (US)

( * ) Notice: Subject to any disclaimer, the term of this patent is extended or adjusted under 35 U.S.C. 154(b) by 0 days.

(21) Appl. No.: 12/580,499

(22) Filed: Oct. 16, 2009

(65) Prior Publication Data
US 2010/0033797 A1 Feb. 11, 2010

Related U.S. Application Data

(63) Continuation of application No. 12/260,499, filed on Oct. 29, 2008, now abandoned, which is a continuation of application No. 10/956,749, filed on Oct. 1, 2004, now Pat. No. 7,446,924.

(60) Provisional application No. 60/508,086, filed on Oct. 2, 2003.

(51) Int. Cl.
*G02F 1/153* (2006.01)

(52) U.S. Cl. .......................................... 359/267; 359/604

(58) Field of Classification Search ........................ None
See application file for complete search history.

(56) References Cited

U.S. PATENT DOCUMENTS

| | | |
|---|---|---|
| 1,096,452 A | 5/1914 | Perrin |
| 1,563,258 A | 11/1925 | Cunningham |
| 2,166,303 A | 7/1939 | Hodny et al. |
| 2,457,348 A | 3/1946 | Chambers |
| 2,561,582 A | 7/1951 | Marbel |
| 3,162,008 A | 12/1964 | Berger et al. |
| 3,185,020 A | 5/1965 | Thelen |
| 3,215,038 A | 11/1965 | Heller et al. |
| 3,280,701 A | 10/1966 | Donnelly et al. |
| 3,432,225 A | 3/1969 | Rock |

(Continued)

FOREIGN PATENT DOCUMENTS

AU A-40317/95 2/1995

(Continued)

OTHER PUBLICATIONS

Stewart, James W.; HP SnapLED: LED Assemblies for Automotive Signal Applications; Nov. 1, 1998; Hewlett-Packard Journal; vol. 50, No. 1, www.hpl.hp.com/hpjournal/98nov/nov98a1.pdf.
Edgar, Julian; Goodbye 12 Volts . . . Hello 42 Volts!; Oct. 5, 1999; Autospeed 50; Issue 50; www.autospeed.co.nz/cms/A_0319/article.html.

(Continued)

*Primary Examiner* — Arnel C Lavarias
*Assistant Examiner* — Derek S Chapel
(74) *Attorney, Agent, or Firm* — Van Dyke, Gardner, Linn & Burkhart, LLP

(57) ABSTRACT

A rearview mirror assembly includes an electrochromic reflective element having a front glass substrate and a rear glass substrate having an electrochromic medium sandwiched therebetween. The reflective element includes (a) a transparent electrically conductive coating disposed at a second surface of a front glass substrate and (b) a mirror reflector disposed at a third surface of a rear glass substrate. A conductive trace is established on a fourth surface of the rear glass substrate. An electrical connector establishes electrical conductivity between the conductive trace and one of (i) the transparent electrically conductive coating disposed at the second surface of the front glass substrate and (ii) the mirror reflector disposed at the third surface of the rear glass substrate. The electrical connector connects to the conductive trace via a solderless connection.

21 Claims, 4 Drawing Sheets

U.S. PATENT DOCUMENTS

| | | |
|---|---|---|
| 3,451,741 A | 6/1969 | Manos |
| 3,453,038 A | 7/1969 | Kissa et al. |
| 3,473,867 A | 10/1969 | Byrnes |
| 3,480,781 A | 11/1969 | Mandalakas |
| 3,499,112 A | 3/1970 | Heilmeier et al. |
| 3,499,702 A | 3/1970 | Goldmacher et al. |
| 3,521,941 A | 7/1970 | Deb et al. |
| 3,543,018 A | 11/1970 | Barcus et al. |
| 3,557,265 A | 1/1971 | Chisholm et al. |
| 3,565,985 A | 2/1971 | Schrenk et al. |
| 3,612,654 A | 10/1971 | Klein et al. |
| 3,614,210 A | 10/1971 | Caplan |
| 3,628,851 A | 12/1971 | Robertson |
| 3,652,149 A | 3/1972 | Rogers |
| 3,676,668 A | 7/1972 | Collins et al. |
| 3,680,951 A | 8/1972 | Jordan et al. |
| 3,692,388 A | 9/1972 | Hall, Jr. et al. |
| 3,711,176 A | 1/1973 | Alfrey, Jr. et al. |
| 3,712,710 A | 1/1973 | Castellion et al. |
| 3,748,017 A | 7/1973 | Yamamura et al. |
| 3,774,988 A | 11/1973 | Rogers |
| 3,781,090 A | 12/1973 | Sumita |
| 3,806,229 A | 4/1974 | Schoot et al. |
| 3,807,832 A | 4/1974 | Castellion |
| 3,807,833 A | 4/1974 | Graham et al. |
| 3,821,590 A | 6/1974 | Kosman et al. |
| 3,854,794 A | 12/1974 | Van Dam et al. |
| 3,860,847 A | 1/1975 | Carley |
| 3,862,798 A | 1/1975 | Hopkins |
| 3,873,185 A | 3/1975 | Rogers |
| 3,876,287 A | 4/1975 | Sprokel |
| 3,932,024 A | 1/1976 | Yaguchi et al. |
| 3,940,822 A | 3/1976 | Emerick et al. |
| 3,956,017 A | 5/1976 | Shigemasa |
| 4,035,681 A | 7/1977 | Savage |
| 4,040,727 A | 8/1977 | Ketchpel |
| 4,075,468 A | 2/1978 | Marcus |
| 4,088,400 A | 5/1978 | Assouline et al. |
| 4,097,131 A | 6/1978 | Nishiyama |
| 4,109,235 A | 8/1978 | Bouthors |
| 4,116,545 A | 9/1978 | Reddy |
| 4,139,234 A | 2/1979 | Morgan |
| 4,142,783 A | 3/1979 | Engler et al. |
| 4,161,653 A | 7/1979 | Bedini et al. |
| 4,174,152 A | 11/1979 | Giglia et al. |
| 4,200,361 A | 4/1980 | Malvano et al. |
| 4,202,607 A | 5/1980 | Washizuka et al. |
| 4,211,955 A | 7/1980 | Ray |
| 4,214,266 A | 7/1980 | Myers |
| 4,219,760 A | 8/1980 | Ferro |
| 4,221,955 A | 9/1980 | Joslyn |
| 4,228,490 A | 10/1980 | Thillays |
| 4,257,703 A | 3/1981 | Goodrich |
| 4,274,078 A | 6/1981 | Isobe et al. |
| 4,277,804 A | 7/1981 | Robison |
| 4,281,899 A | 8/1981 | Oskam |
| 4,282,272 A | 8/1981 | Matsuhiro et al. |
| RE30,835 E | 12/1981 | Giglia |
| 4,304,465 A | 12/1981 | Diaz |
| 4,306,768 A | 12/1981 | Egging |
| 4,306,774 A | 12/1981 | Nicholson |
| 4,310,851 A | 1/1982 | Pierrat |
| 4,331,382 A | 5/1982 | Graff |
| 4,338,000 A | 7/1982 | Kamimori et al. |
| 4,377,613 A | 3/1983 | Gordon |
| 4,398,805 A | 8/1983 | Cole |
| 4,419,386 A | 12/1983 | Gordon |
| 4,435,042 A | 3/1984 | Wood et al. |
| 4,435,048 A | 3/1984 | Kamimori et al. |
| 4,436,371 A | 3/1984 | Wood et al. |
| 4,438,348 A | 3/1984 | Casper et al. |
| 4,446,171 A | 5/1984 | Thomas |
| 4,449,786 A | 5/1984 | McCord |
| 4,465,339 A | 8/1984 | Baucke et al. |
| 4,473,695 A | 9/1984 | Wrighton et al. |
| 4,490,227 A | 12/1984 | Bitter |
| 4,491,390 A | 1/1985 | Tong-Shen |
| 4,499,451 A | 2/1985 | Suzuki et al. |
| 4,519,930 A | 5/1985 | Kakiuchi |
| 4,521,079 A | 6/1985 | Leenhouts et al. |
| 4,524,941 A | 6/1985 | Wood et al. |
| 4,538,063 A | 8/1985 | Bulat |
| 4,546,551 A | 10/1985 | Franks |
| 4,550,982 A | 11/1985 | Hirai |
| 4,555,694 A | 11/1985 | Yanagishima et al. |
| 4,561,625 A | 12/1985 | Weaver |
| 4,572,619 A | 2/1986 | Reininger et al. |
| 4,580,196 A | 4/1986 | Task |
| 4,586,792 A | 5/1986 | Yang et al. |
| 4,588,267 A | 5/1986 | Pastore |
| 4,603,946 A | 8/1986 | Kato et al. |
| 4,613,211 A | 9/1986 | Papir et al. |
| 4,623,222 A | 11/1986 | Itoh et al. |
| 4,625,210 A | 11/1986 | Sagl |
| 4,630,040 A | 12/1986 | Haertling |
| 4,630,904 A | 12/1986 | Pastore |
| 4,634,835 A | 1/1987 | Suzuki |
| 4,635,033 A | 1/1987 | Inukai et al. |
| 4,636,782 A | 1/1987 | Nakamura et al. |
| 4,638,287 A | 1/1987 | Umebayashi et al. |
| 4,646,210 A | 2/1987 | Skogler et al. |
| 4,652,090 A | 3/1987 | Uchikawa et al. |
| 4,655,549 A | 4/1987 | Suzuki et al. |
| 4,665,311 A | 5/1987 | Cole |
| 4,665,430 A | 5/1987 | Hiroyasu |
| 4,669,827 A | 6/1987 | Fukada et al. |
| 4,671,615 A | 6/1987 | Fukada et al. |
| 4,671,619 A | 6/1987 | Kamimori et al. |
| 4,678,281 A | 7/1987 | Bauer |
| 4,682,083 A | 7/1987 | Alley |
| 4,692,798 A | 9/1987 | Seko et al. |
| 4,697,883 A | 10/1987 | Suzuki et al. |
| 4,701,022 A | 10/1987 | Jacob |
| 4,702,566 A | 10/1987 | Takude et al. |
| 4,712,879 A | 12/1987 | Lynam et al. |
| RE032,576 E | 1/1988 | Pastore |
| 4,718,756 A | 1/1988 | Lancaster |
| 4,721,364 A | 1/1988 | Itoh et al. |
| 4,729,076 A | 3/1988 | Masami et al. |
| 4,733,335 A | 3/1988 | Serizawa et al. |
| 4,733,336 A | 3/1988 | Skogler et al. |
| 4,740,838 A | 4/1988 | Mase et al. |
| 4,741,603 A | 5/1988 | Miyagi et al. |
| 4,750,817 A | 6/1988 | Sammells |
| 4,761,061 A | 8/1988 | Nishiyama et al. |
| 4,780,752 A | 10/1988 | Angerstein et al. |
| 4,781,436 A | 11/1988 | Armbruster |
| 4,793,690 A | 12/1988 | Gahan et al. |
| 4,793,695 A | 12/1988 | Wada et al. |
| 4,794,261 A | 12/1988 | Rosen |
| D299,491 S | 1/1989 | Masuda |
| 4,795,242 A | 1/1989 | Fred et al. |
| 4,803,599 A | 2/1989 | Trine et al. |
| 4,807,096 A | 2/1989 | Skogler et al. |
| 4,807,977 A | 2/1989 | Sammells |
| 4,810,067 A | 3/1989 | Demiryont |
| 4,820,933 A | 4/1989 | Hong et al. |
| 4,827,086 A | 5/1989 | Rockwell |
| 4,832,467 A | 5/1989 | Miyagi et al. |
| 4,837,551 A | 6/1989 | Iino |
| 4,845,402 A | 7/1989 | Smith |
| 4,855,161 A | 8/1989 | Moser et al. |
| 4,855,550 A | 8/1989 | Schultz, Jr. |
| 4,859,813 A | 8/1989 | Rockwell |
| 4,871,236 A | 10/1989 | Gemma et al. |
| 4,872,745 A | 10/1989 | Fujisawa et al. |
| 4,882,466 A | 11/1989 | Friel |
| 4,882,565 A | 11/1989 | Gallmeyer |
| 4,883,349 A | 11/1989 | Mittelhäuser |
| 4,884,135 A | 11/1989 | Schiffman |
| 4,891,828 A | 1/1990 | Kawazoe |
| 4,893,908 A | 1/1990 | Wolf et al. |
| 4,902,103 A | 2/1990 | Miyake et al. |
| 4,902,108 A | 2/1990 | Byker |
| 4,908,283 A | 3/1990 | Takahashi et al. |
| 4,910,591 A | 3/1990 | Petrossian et al. |
| 4,927,246 A | 5/1990 | Ito et al. |

| Patent No. | Date | Inventor |
|---|---|---|
| 4,930,742 A | 6/1990 | Schofield et al. |
| 4,935,665 A | 6/1990 | Murata |
| 4,936,533 A | 6/1990 | Adams et al. |
| 4,953,305 A | 9/1990 | Van Lente et al. |
| 4,959,247 A | 9/1990 | Moser et al. |
| 4,959,865 A | 9/1990 | Stettiner et al. |
| 4,962,158 A | 10/1990 | Kobayashi et al. |
| 4,973,844 A | 11/1990 | O'Farrell |
| 4,978,196 A | 12/1990 | Suzuki et al. |
| 4,983,951 A | 1/1991 | Igarashi et al. |
| 4,993,810 A | 2/1991 | Demiryont |
| 4,996,083 A | 2/1991 | Moser et al. |
| 5,001,386 A | 3/1991 | Sullivan et al. |
| 5,005,213 A | 4/1991 | Hanson et al. |
| 5,006,971 A | 4/1991 | Jenkins |
| 5,014,167 A | 5/1991 | Roberts |
| 5,016,996 A | 5/1991 | Ueno |
| 5,017,903 A | 5/1991 | Krippelz, Sr. |
| 5,027,200 A | 6/1991 | Petrossian et al. |
| 5,028,124 A | 7/1991 | Akhtar |
| 5,037,182 A | 8/1991 | Groves et al. |
| 5,038,255 A | 8/1991 | Nishihashi et al. |
| 5,042,923 A | 8/1991 | Wolf et al. |
| 5,056,899 A | 10/1991 | Warszawski |
| 5,058,851 A | 10/1991 | Lawlor et al. |
| 5,059,015 A | 10/1991 | Tran |
| 5,066,108 A | 11/1991 | McDonald |
| 5,066,112 A | 11/1991 | Lynam et al. |
| 5,068,062 A | 11/1991 | Inata et al. |
| 5,070,323 A | 12/1991 | Iino et al. |
| 5,073,012 A | 12/1991 | Lynam |
| 5,076,673 A | 12/1991 | Lynam et al. |
| 5,076,674 A | 12/1991 | Lynam |
| 5,080,471 A | 1/1992 | Cogan et al. |
| 5,100,095 A | 3/1992 | Haan et al. |
| 5,101,139 A | 3/1992 | Lechter |
| 5,105,127 A | 4/1992 | Lavaud et al. |
| 5,115,346 A | 5/1992 | Lynam |
| 5,117,346 A | 5/1992 | Gard |
| 5,121,200 A | 6/1992 | Choi et al. |
| 5,122,619 A | 6/1992 | Dlubak |
| 5,122,896 A | 6/1992 | Mizusaki et al. |
| 5,124,845 A | 6/1992 | Shimojo |
| 5,128,799 A | 7/1992 | Byker |
| 5,135,298 A | 8/1992 | Feltman |
| 5,136,483 A | 8/1992 | Schöniger et al. |
| 5,140,455 A | 8/1992 | Varaprasad et al. |
| 5,142,407 A | 8/1992 | Varaprasad et al. |
| 5,145,609 A | 9/1992 | Varaprasad et al. |
| 5,148,014 A | 9/1992 | Lynam et al. |
| 5,150,232 A | 9/1992 | Gunkima et al. |
| 5,151,816 A | 9/1992 | Varaprasad et al. |
| 5,151,824 A | 9/1992 | O'Farrell |
| 5,154,617 A | 10/1992 | Suman et al. |
| 5,158,638 A | 10/1992 | Osanami et al. |
| 5,160,200 A | 11/1992 | Cheselske |
| 5,160,201 A | 11/1992 | Wrobel |
| 5,168,378 A | 12/1992 | Black et al. |
| 5,177,031 A | 1/1993 | Buchmann et al. |
| 5,178,448 A | 1/1993 | Adams et al. |
| 5,179,471 A | 1/1993 | Caskey et al. |
| 5,189,537 A | 2/1993 | O'Farrell |
| 5,193,029 A | 3/1993 | Schofield et al. |
| 5,197,562 A | 3/1993 | Kakinami et al. |
| 5,202,787 A | 4/1993 | Byker et al. |
| 5,207,492 A | 5/1993 | Roberts |
| 5,210,967 A | 5/1993 | Brown |
| 5,217,794 A | 6/1993 | Schrenk |
| 5,223,814 A | 6/1993 | Suman |
| 5,230,400 A | 7/1993 | Kakinami et al. |
| 5,233,461 A | 8/1993 | Dornan et al. |
| 5,239,405 A | 8/1993 | Varaprasad et al. |
| 5,239,406 A | 8/1993 | Lynam et al. |
| 5,243,417 A | 9/1993 | Pollard |
| 5,252,354 A | 10/1993 | Cronin et al. |
| 5,253,109 A | 10/1993 | O'Farrell et al. |
| 5,255,442 A | 10/1993 | Schierbeek et al. |
| 5,260,626 A | 11/1993 | Takase et al. |
| 5,277,986 A | 1/1994 | Cronin et al. |
| 5,278,693 A | 1/1994 | Theiste et al. |
| 5,280,380 A | 1/1994 | Byker |
| 5,282,077 A | 1/1994 | Byker |
| 5,285,060 A | 2/1994 | Larson et al. |
| 5,289,321 A | 2/1994 | Secor |
| 5,296,924 A | 3/1994 | Blancard et al. |
| 5,303,205 A | 4/1994 | Gauthier et al. |
| 5,304,980 A | 4/1994 | Maekawa |
| 5,313,335 A | 5/1994 | Gray et al. |
| 5,330,149 A | 7/1994 | Haan et al. |
| 5,331,358 A | 7/1994 | Schurle et al. |
| 5,355,284 A | 10/1994 | Roberts |
| 5,361,190 A | 11/1994 | Roberts et al. |
| 5,371,659 A | 12/1994 | Pastrick et al. |
| 5,386,285 A | 1/1995 | Asayama |
| 5,386,306 A | 1/1995 | Gunjima et al. |
| 5,400,158 A | 3/1995 | Ohnishi et al. |
| 5,402,103 A | 3/1995 | Tashiro |
| 5,406,414 A | 4/1995 | O'Farrell et al. |
| 5,408,353 A | 4/1995 | Nichols et al. |
| 5,408,357 A | 4/1995 | Beukema |
| 5,414,439 A | 5/1995 | Groves et al. |
| 5,414,461 A | 5/1995 | Kishi et al. |
| 5,416,313 A | 5/1995 | Larson et al. |
| 5,416,478 A | 5/1995 | Morinaga |
| 5,418,610 A | 5/1995 | Fischer |
| 5,422,756 A | 6/1995 | Weber |
| 5,424,865 A | 6/1995 | Lynam |
| 5,424,952 A | 6/1995 | Asayama |
| 5,432,496 A | 7/1995 | Lin |
| 5,432,626 A | 7/1995 | Sasuga et al. |
| 5,436,741 A | 7/1995 | Crandall |
| 5,444,478 A | 8/1995 | LeLong et al. |
| 5,446,576 A | 8/1995 | Lynam et al. |
| 5,457,218 A | 10/1995 | Cronin et al. |
| D363,920 S | 11/1995 | Roberts et al. |
| 5,469,298 A | 11/1995 | Suman et al. |
| 5,475,494 A | 12/1995 | Nishida et al. |
| 5,481,409 A | 1/1996 | Roberts |
| 5,483,453 A | 1/1996 | Uemura et al. |
| 5,485,378 A | 1/1996 | Franke et al. |
| 5,487,522 A | 1/1996 | Hook |
| 5,488,496 A | 1/1996 | Pine |
| 5,497,305 A | 3/1996 | Pastrick et al. |
| 5,497,306 A | 3/1996 | Pastrick |
| 5,500,760 A | 3/1996 | Varaprasad et al. |
| 5,515,448 A | 5/1996 | Nishitani |
| 5,521,744 A | 5/1996 | Mazurek |
| 5,521,760 A | 5/1996 | De Young et al. |
| 5,523,811 A | 6/1996 | Wada et al. |
| 5,525,264 A | 6/1996 | Cronin et al. |
| 5,525,977 A | 6/1996 | Suman |
| 5,528,422 A | 6/1996 | Roberts |
| 5,528,474 A | 6/1996 | Roney et al. |
| 5,530,240 A | 6/1996 | Larson et al. |
| 5,530,421 A | 6/1996 | Marshall et al. |
| 5,535,056 A | 7/1996 | Caskey et al. |
| 5,535,144 A | 7/1996 | Kise |
| 5,541,590 A | 7/1996 | Nishio |
| 5,550,677 A | 8/1996 | Schofield et al. |
| 5,555,172 A | 9/1996 | Potter |
| 5,561,333 A | 10/1996 | Darius |
| 5,567,360 A | 10/1996 | Varaprasad et al. |
| 5,568,316 A | 10/1996 | Schrenk et al. |
| 5,570,127 A | 10/1996 | Schmidt |
| 5,572,354 A | 11/1996 | Desmond et al. |
| 5,574,426 A | 11/1996 | Shisgal et al. |
| 5,574,443 A | 11/1996 | Hsieh |
| 5,576,687 A | 11/1996 | Blank et al. |
| 5,576,854 A | 11/1996 | Schmidt et al. |
| 5,576,975 A | 11/1996 | Sasaki et al. |
| 5,578,404 A | 11/1996 | Kliem |
| 5,587,236 A | 12/1996 | Agrawal et al. |
| 5,587,699 A | 12/1996 | Faloon et al. |
| 5,594,222 A | 1/1997 | Caldwell |
| 5,594,615 A | 1/1997 | Spijkerman et al. |
| 5,602,542 A | 2/1997 | Widmann et al. |
| 5,602,670 A | 2/1997 | Keegan |
| 5,607,538 A | 3/1997 | Cooke |

| | | | | | |
|---|---|---|---|---|---|
| 5,608,550 A | 3/1997 | Epstein et al. | 5,796,176 A | 8/1998 | Kramer et al. |
| 5,610,380 A | 3/1997 | Nicholaisen | 5,798,057 A | 8/1998 | Hikmet |
| 5,610,756 A | 3/1997 | Lynam et al. | 5,798,575 A | 8/1998 | O'Farrell et al. |
| 5,611,966 A | 3/1997 | Varaprasad et al. | 5,798,688 A | 8/1998 | Schofield |
| 5,614,885 A | 3/1997 | Van Lente et al. | 5,800,918 A | 9/1998 | Chartier et al. |
| 5,615,023 A | 3/1997 | Yang | 5,802,727 A | 9/1998 | Blank et al. |
| 5,615,857 A | 4/1997 | Hook | 5,803,579 A | 9/1998 | Turnbull et al. |
| 5,617,085 A | 4/1997 | Tsutsumi et al. | 5,805,330 A | 9/1998 | Byker et al. |
| 5,619,374 A | 4/1997 | Roberts | 5,805,367 A | 9/1998 | Kanazawa |
| 5,619,375 A | 4/1997 | Roberts | 5,806,965 A | 9/1998 | Deese |
| 5,626,800 A | 5/1997 | Williams et al. | 5,808,589 A | 9/1998 | Fergason |
| 5,631,089 A | 5/1997 | Center, Jr. et al. | 5,808,713 A | 9/1998 | Broer et al. |
| 5,631,638 A | 5/1997 | Kaspar et al. | 5,808,777 A | 9/1998 | Lynam et al. |
| 5,632,092 A | 5/1997 | Blank et al. | 5,808,778 A | 9/1998 | Bauer et al. |
| 5,632,551 A | 5/1997 | Roney et al. | 5,813,745 A | 9/1998 | Fant, Jr. et al. |
| 5,634,709 A | 6/1997 | Iwama | 5,818,625 A | 10/1998 | Bauer et al. |
| 5,640,216 A | 6/1997 | Hasegawa et al. | 5,820,097 A | 10/1998 | Spooner |
| 5,642,238 A | 6/1997 | Sala | 5,820,245 A | 10/1998 | Desmond et al. |
| 5,644,851 A | 7/1997 | Blank et al. | 5,822,023 A | 10/1998 | Suman et al. |
| 5,646,614 A | 7/1997 | Abersfelder et al. | 5,823,654 A | 10/1998 | Pastrick et al. |
| 5,649,756 A | 7/1997 | Adams et al. | 5,825,527 A | 10/1998 | Forgette et al. |
| 5,650,765 A | 7/1997 | Park | 5,835,166 A | 11/1998 | Hall et al. |
| 5,650,929 A | 7/1997 | Potter et al. | 5,837,994 A | 11/1998 | Stam et al. |
| 5,661,651 A | 8/1997 | Geschke et al. | 5,844,505 A | 12/1998 | Van Ryzin |
| 5,661,804 A | 8/1997 | Dykema et al. | 5,850,176 A | 12/1998 | Kinoshita et al. |
| 5,662,375 A | 9/1997 | Adams et al. | 5,850,205 A | 12/1998 | Blouin |
| 5,668,663 A | 9/1997 | Varaprasad et al. | 5,863,116 A | 1/1999 | Pastrick et al. |
| 5,669,698 A | 9/1997 | Veldman et al. | 5,864,419 A | 1/1999 | Lynam |
| 5,669,699 A | 9/1997 | Pastrick et al. | 5,871,275 A | 2/1999 | O'Farrell et al. |
| 5,669,704 A | 9/1997 | Pastrick | 5,871,843 A | 2/1999 | Yoneda et al. |
| 5,669,705 A | 9/1997 | Pastrick et al. | 5,877,707 A | 3/1999 | Kowalick |
| 5,670,935 A | 9/1997 | Schofield et al. | 5,877,897 A | 3/1999 | Schofield et al. |
| 5,671,996 A | 9/1997 | Bos et al. | 5,878,370 A | 3/1999 | Olson |
| 5,673,994 A | 10/1997 | Fant, Jr. et al. | 5,879,074 A | 3/1999 | Pastrick |
| 5,673,999 A | 10/1997 | Koenck | 5,883,605 A | 3/1999 | Knapp |
| 5,677,598 A | 10/1997 | De Hair et al. | 5,883,739 A | 3/1999 | Ashihara et al. |
| 5,680,123 A | 10/1997 | Lee | 5,888,431 A | 3/1999 | Tonar et al. |
| 5,680,245 A | 10/1997 | Lynam | D409,540 S | 5/1999 | Muth |
| 5,680,263 A | 10/1997 | Zimmermann et al. | 5,899,551 A | 5/1999 | Neijzen et al. |
| 5,686,975 A | 11/1997 | Lipton | 5,899,956 A | 5/1999 | Chan |
| 5,686,979 A | 11/1997 | Weber et al. | 5,904,729 A | 5/1999 | Ruzicka |
| 5,692,819 A | 12/1997 | Mitsutake et al. | 5,910,854 A | 6/1999 | Varaprasad et al. |
| 5,699,044 A | 12/1997 | Van Lente et al. | 5,914,815 A | 6/1999 | Bos |
| 5,699,188 A | 12/1997 | Gilbert et al. | 5,917,664 A | 6/1999 | O'Neill et al. |
| 5,708,410 A | 1/1998 | Blank | 5,923,027 A | 7/1999 | Stam et al. |
| 5,708,857 A | 1/1998 | Ishibashi | 5,923,457 A | 7/1999 | Byker et al. |
| 5,715,093 A | 2/1998 | Schierbeek et al. | 5,924,212 A | 7/1999 | Domanski |
| 5,724,187 A | 3/1998 | Varaprasad et al. | 5,926,087 A | 7/1999 | Busch et al. |
| 5,724,316 A | 3/1998 | Brunts | 5,927,792 A | 7/1999 | Welling et al. |
| 5,729,194 A | 3/1998 | Spears et al. | 5,928,572 A | 7/1999 | Tonar et al. |
| 5,737,226 A | 4/1998 | Olson et al. | 5,929,786 A | 7/1999 | Schofield et al. |
| 5,741,966 A | 4/1998 | Handfield et al. | 5,935,702 A | 8/1999 | Macquart et al. |
| 5,744,227 A | 4/1998 | Bright et al. | 5,938,320 A | 8/1999 | Crandall |
| 5,745,050 A | 4/1998 | Nakagawa | 5,938,321 A | 8/1999 | Bos et al. |
| 5,745,266 A | 4/1998 | Smith | 5,940,011 A | 8/1999 | Agravante et al. |
| 5,748,172 A | 5/1998 | Song et al. | 5,940,120 A | 8/1999 | Frankhouse et al. |
| 5,748,287 A | 5/1998 | Takahashi et al. | 5,940,201 A | 8/1999 | Ash et al. |
| 5,751,211 A | 5/1998 | Shirai et al. | 5,949,331 A | 9/1999 | Schofield et al. |
| 5,751,390 A | 5/1998 | Crawford et al. | 5,956,079 A | 9/1999 | Ridgley |
| 5,751,489 A | 5/1998 | Caskey et al. | 5,956,181 A | 9/1999 | Lin |
| 5,754,099 A | 5/1998 | Nishimura et al. | 5,959,367 A | 9/1999 | O'Farrell et al. |
| D394,833 S | 6/1998 | Muth | 5,959,555 A | 9/1999 | Furuta |
| 5,760,828 A | 6/1998 | Cortes | 5,965,247 A | 10/1999 | Jonza et al. |
| 5,760,962 A | 6/1998 | Schofield et al. | 5,968,538 A | 10/1999 | Snyder, Jr. |
| 5,761,094 A | 6/1998 | Olson et al. | 5,971,552 A | 10/1999 | O'Farrell et al. |
| 5,762,823 A | 6/1998 | Hikmet | 5,973,760 A | 10/1999 | Dehmlow |
| 5,764,139 A | 6/1998 | Nojima et al. | 5,975,715 A | 11/1999 | Bauder |
| 5,765,940 A | 6/1998 | Levy et al. | 5,984,482 A | 11/1999 | Rumsey et al. |
| 5,767,793 A | 6/1998 | Agravante et al. | 5,986,730 A | 11/1999 | Hansen et al. |
| 5,768,020 A | 6/1998 | Nagao | 5,990,469 A | 11/1999 | Bechtel et al. |
| 5,775,762 A | 7/1998 | Vitito | 5,990,625 A | 11/1999 | Meissner et al. |
| 5,777,779 A | 7/1998 | Hashimoto et al. | 5,995,180 A | 11/1999 | Moriwaki et al. |
| 5,780,160 A | 7/1998 | Allemand et al. | 5,998,617 A | 12/1999 | Srinivasa et al. |
| 5,786,772 A | 7/1998 | Schofield et al. | 5,998,929 A | 12/1999 | Bechtel et al. |
| 5,788,357 A | 8/1998 | Muth et al. | 6,000,823 A | 12/1999 | Desmond et al. |
| 5,790,973 A | 8/1998 | Blaker et al. | 6,001,486 A | 12/1999 | Varaprasad et al. |
| 5,793,308 A | 8/1998 | Rosinski et al. | 6,002,511 A | 12/1999 | Varaprasad et al. |
| 5,793,420 A | 8/1998 | Schmidt | 6,002,544 A | 12/1999 | Yatsu |
| 5,796,094 A | 8/1998 | Schofield et al. | 6,005,724 A | 12/1999 | Todd |

| | | | | | | |
|---|---|---|---|---|---|---|
| 6,007,222 A | 12/1999 | Thau | | 6,142,656 A | 11/2000 | Kurth |
| 6,008,486 A | 12/1999 | Stam et al. | | 6,146,003 A | 11/2000 | Thau |
| 6,008,871 A | 12/1999 | Okumura | | 6,147,934 A | 11/2000 | Arikawa et al. |
| 6,009,359 A | 12/1999 | El-Hakim et al. | | 6,149,287 A | 11/2000 | Pastrick et al. |
| 6,016,035 A | 1/2000 | Eberspacher et al. | | 6,150,014 A | 11/2000 | Chu et al. |
| 6,016,215 A | 1/2000 | Byker | | 6,151,065 A | 11/2000 | Steed et al. |
| 6,019,411 A | 2/2000 | Carter et al. | | 6,151,539 A | 11/2000 | Bergholz et al. |
| 6,019,475 A | 2/2000 | Lynam et al. | | 6,152,551 A | 11/2000 | Annas |
| 6,023,229 A | 2/2000 | Bugno et al. | | 6,152,590 A | 11/2000 | Furst et al. |
| 6,025,872 A | 2/2000 | Ozaki et al. | | 6,154,149 A | 11/2000 | Tychkowski et al. |
| 6,028,537 A | 2/2000 | Suman et al. | | 6,154,306 A | 11/2000 | Varaprasad et al. |
| 6,037,689 A | 3/2000 | Bingle et al. | | 6,157,294 A | 12/2000 | Urai et al. |
| 6,040,939 A | 3/2000 | Demiryont et al. | | 6,157,418 A | 12/2000 | Rosen |
| 6,042,253 A | 3/2000 | Fant, Jr. et al. | | 6,158,655 A | 12/2000 | DeVries, Jr. et al. |
| 6,042,934 A | 3/2000 | Guiselin et al. | | 6,163,083 A | 12/2000 | Kramer et al. |
| 6,045,243 A | 4/2000 | Muth et al. | | 6,166,625 A | 12/2000 | Teowee et al. |
| 6,045,643 A | 4/2000 | Byker et al. | | 6,166,628 A | 12/2000 | Andreas |
| 6,046,766 A | 4/2000 | Sakata | | 6,166,847 A | 12/2000 | Tench et al. |
| 6,046,837 A | 4/2000 | Yamamoto | | 6,166,848 A | 12/2000 | Cammenga et al. |
| 6,049,171 A | 4/2000 | Stam et al. | | 6,167,755 B1 | 1/2001 | Damson et al. |
| D425,466 S | 5/2000 | Todd et al. | | 6,169,955 B1 | 1/2001 | Fultz |
| 6,060,989 A | 5/2000 | Gehlot | | 6,170,956 B1 | 1/2001 | Rumsey et al. |
| 6,061,002 A | 5/2000 | Weber et al. | | 6,172,600 B1 | 1/2001 | Kakinami et al. |
| 6,062,920 A * | 5/2000 | Jordan et al. ............ 439/861 | | 6,172,601 B1 | 1/2001 | Wada et al. |
| 6,064,508 A | 5/2000 | Forgette et al. | | 6,172,613 B1 | 1/2001 | DeLine et al. |
| 6,065,840 A | 5/2000 | Caskey et al. | | 6,173,501 B1 | 1/2001 | Blank et al. |
| 6,066,920 A | 5/2000 | Torihara et al. | | 6,175,164 B1 | 1/2001 | O'Farrell et al. |
| 6,067,111 A | 5/2000 | Hahn et al. | | 6,175,300 B1 | 1/2001 | Kendrick |
| 6,068,380 A | 5/2000 | Lynn et al. | | 6,176,602 B1 | 1/2001 | Pastrick et al. |
| D426,506 S | 6/2000 | Todd et al. | | 6,178,034 B1 | 1/2001 | Allemand et al. |
| D426,507 S | 6/2000 | Todd et al. | | 6,181,387 B1 | 1/2001 | Rosen |
| D427,128 S | 6/2000 | Mathieu | | 6,183,119 B1 | 2/2001 | Desmond et al. |
| 6,072,391 A | 6/2000 | Suzuki et al. | | 6,184,781 B1 | 2/2001 | Ramakesavan |
| 6,074,077 A | 6/2000 | Pastrick et al. | | 6,185,492 B1 | 2/2001 | Kagawa et al. |
| 6,074,777 A | 6/2000 | Reimers et al. | | 6,188,505 B1 | 2/2001 | Lomprey et al. |
| 6,076,948 A | 6/2000 | Bukosky et al. | | 6,191,704 B1 | 2/2001 | Takenaga et al. |
| 6,078,355 A | 6/2000 | Zengel | | 6,195,194 B1 | 2/2001 | Roberts et al. |
| 6,078,865 A | 6/2000 | Koyanagi | | 6,196,688 B1 | 3/2001 | Caskey et al. |
| D428,372 S | 7/2000 | Todd et al. | | 6,198,409 B1 | 3/2001 | Schofield et al. |
| D428,373 S | 7/2000 | Todd et al. | | 6,199,014 B1 | 3/2001 | Walker et al. |
| 6,082,881 A | 7/2000 | Hicks | | 6,199,810 B1 | 3/2001 | Wu et al. |
| 6,084,700 A | 7/2000 | Knapp et al. | | 6,200,010 B1 | 3/2001 | Anders |
| 6,086,131 A | 7/2000 | Bingle et al. | | 6,201,642 B1 | 3/2001 | Bos |
| 6,086,229 A | 7/2000 | Pastrick | | 6,206,553 B1 | 3/2001 | Boddy et al. |
| 6,087,012 A | 7/2000 | Varaprasad et al. | | 6,210,008 B1 | 4/2001 | Hoekstra et al. |
| 6,087,953 A | 7/2000 | DeLine et al. | | 6,210,012 B1 | 4/2001 | Broer |
| 6,089,721 A | 7/2000 | Schierbeek | | 6,217,181 B1 | 4/2001 | Lynam et al. |
| 6,091,343 A | 7/2000 | Dykema et al. | | 6,218,934 B1 | 4/2001 | Regan |
| 6,093,976 A | 7/2000 | Kramer et al. | | 6,222,447 B1 | 4/2001 | Schofield |
| D428,842 S | 8/2000 | Todd et al. | | 6,222,460 B1 | 4/2001 | DeLine et al. |
| D429,202 S | 8/2000 | Todd et al. | | 6,222,689 B1 | 4/2001 | Higuchi et al. |
| D430,088 S | 8/2000 | Todd et al. | | 6,227,689 B1 | 5/2001 | Miller |
| 6,097,023 A | 8/2000 | Schofield et al. | | 6,232,937 B1 | 5/2001 | Jacobsen et al. |
| 6,099,131 A | 8/2000 | Fletcher et al. | | 6,239,851 B1 | 5/2001 | Hatazawa et al. |
| 6,099,155 A | 8/2000 | Pastrick et al. | | 6,239,898 B1 | 5/2001 | Byker et al. |
| 6,102,559 A | 8/2000 | Nold et al. | | 6,239,899 B1 | 5/2001 | DeVries et al. |
| 6,104,552 A | 8/2000 | Thau et al. | | 6,243,003 B1 | 6/2001 | DeLine et al. |
| 6,106,121 A | 8/2000 | Buckley et al. | | 6,244,716 B1 | 6/2001 | Steenwyk et al. |
| 6,111,498 A | 8/2000 | Jobes et al. | | 6,245,262 B1 | 6/2001 | Varaprasad et al. |
| 6,111,683 A | 8/2000 | Cammenga et al. | | 6,247,820 B1 | 6/2001 | Van Order |
| 6,111,684 A | 8/2000 | Forgette et al. | | 6,249,214 B1 | 6/2001 | Kashiwazaki |
| 6,111,685 A | 8/2000 | Tench et al. | | 6,249,310 B1 | 6/2001 | Lefkowitz |
| 6,111,696 A | 8/2000 | Allen et al. | | 6,250,148 B1 | 6/2001 | Lynam |
| 6,115,086 A | 9/2000 | Rosen | | 6,250,766 B1 | 6/2001 | Strumolo et al. |
| 6,115,651 A | 9/2000 | Cruz | | 6,250,783 B1 | 6/2001 | Stidham et al. |
| 6,116,743 A | 9/2000 | Hoek | | 6,255,639 B1 | 7/2001 | Stam et al. |
| 6,118,219 A | 9/2000 | Okigami et al. | | 6,257,746 B1 | 7/2001 | Todd et al. |
| 6,122,597 A | 9/2000 | Saneyoshi et al. | | 6,259,412 B1 | 7/2001 | Duroux |
| 6,122,921 A | 9/2000 | Brezoczky et al. | | 6,259,475 B1 | 7/2001 | Ramachandran et al. |
| 6,124,647 A | 9/2000 | Marcus et al. | | 6,262,842 B1 | 7/2001 | Ouderkirk et al. |
| 6,124,886 A | 9/2000 | DeLine et al. | | 6,264,353 B1 | 7/2001 | Caraher et al. |
| 6,127,919 A | 10/2000 | Wylin | | 6,265,968 B1 | 7/2001 | Betzitza et al. |
| 6,128,576 A | 10/2000 | Nishimoto et al. | | 6,268,803 B1 | 7/2001 | Gunderson et al. |
| 6,130,421 A | 10/2000 | Bechtel et al. | | 6,268,837 B1 | 7/2001 | Kobayashi et al. |
| 6,130,448 A | 10/2000 | Bauer et al. | | 6,269,308 B1 | 7/2001 | Kodaka et al. |
| 6,132,072 A | 10/2000 | Turnbull et al. | | 6,271,901 B1 | 8/2001 | Ide et al. |
| 6,139,171 A | 10/2000 | Waldmann | | 6,274,221 B2 | 8/2001 | Smith et al. |
| 6,139,172 A | 10/2000 | Bos et al. | | 6,276,821 B1 | 8/2001 | Pastrick et al. |
| 6,140,933 A | 10/2000 | Bugno et al. | | 6,276,822 B1 | 8/2001 | Bedrosian et al. |

| | | | | | |
|---|---|---|---|---|---|
| 6,277,471 B1 | 8/2001 | Tang | 6,420,975 B1 | 7/2002 | DeLine et al. |
| 6,278,377 B1 | 8/2001 | DeLine et al. | 6,421,081 B1 | 7/2002 | Markus |
| 6,278,941 B1 | 8/2001 | Yokoyama | 6,424,272 B1 | 7/2002 | Gutta et al. |
| 6,280,068 B1 | 8/2001 | Mertens et al. | 6,424,273 B1 | 7/2002 | Gutta et al. |
| 6,280,069 B1 | 8/2001 | Pastrick et al. | 6,424,892 B1 | 7/2002 | Matsuoka |
| 6,281,804 B1 | 8/2001 | Haller et al. | 6,426,492 B1 | 7/2002 | Bos et al. |
| 6,286,965 B1 | 9/2001 | Caskey et al. | 6,426,568 B2 | 7/2002 | Turnbull et al. |
| 6,286,984 B1 | 9/2001 | Berg | 6,427,349 B1 | 8/2002 | Blank et al. |
| 6,289,332 B2 | 9/2001 | Menig et al. | 6,428,172 B1 | 8/2002 | Hutzel et al. |
| 6,290,378 B1 | 9/2001 | Buchalla et al. | 6,433,676 B2 | 8/2002 | DeLine et al. |
| 6,291,906 B1 | 9/2001 | Marcus et al. | 6,433,680 B1 | 8/2002 | Ho |
| 6,294,989 B1 | 9/2001 | Schofield et al. | 6,433,914 B1 | 8/2002 | Lomprey et al. |
| 6,296,379 B1 | 10/2001 | Pastrick | 6,437,688 B1 | 8/2002 | Kobayashi |
| 6,297,781 B1 | 10/2001 | Turnbull et al. | 6,438,491 B1 | 8/2002 | Farmer |
| 6,299,333 B1 | 10/2001 | Pastrick et al. | 6,439,755 B1 | 8/2002 | Fant et al. |
| 6,300,879 B1 | 10/2001 | Regan et al. | 6,441,872 B1 | 8/2002 | Ho |
| 6,301,039 B1 | 10/2001 | Tench | 6,441,943 B1 | 8/2002 | Roberts et al. |
| 6,304,173 B2 | 10/2001 | Pala et al. | 6,441,963 B2 | 8/2002 | Murakami et al. |
| 6,305,807 B1 | 10/2001 | Schierbeek | 6,445,287 B1 | 9/2002 | Schofield et al. |
| 6,310,611 B1 | 10/2001 | Caldwell | 6,447,128 B1 | 9/2002 | Lang et al. |
| 6,310,714 B1 | 10/2001 | Lomprey et al. | 6,452,533 B1 | 9/2002 | Yamabuchi et al. |
| 6,310,738 B1 | 10/2001 | Chu | 6,462,795 B1 | 10/2002 | Clarke |
| 6,313,454 B1 | 11/2001 | Bos et al. | 6,463,369 B2 | 10/2002 | Sadano et al. |
| 6,315,440 B1 | 11/2001 | Satoh | 6,466,701 B1 | 10/2002 | Ejiri et al. |
| 6,317,057 B1 | 11/2001 | Lee | 6,471,362 B1 | 10/2002 | Carter et al. |
| 6,317,180 B1 | 11/2001 | Kuroiwa et al. | 6,472,977 B1 | 10/2002 | Pöchmüller |
| 6,317,248 B1 | 11/2001 | Agrawal et al. | 6,472,979 B2 | 10/2002 | Schofield et al. |
| 6,318,870 B1 | 11/2001 | Spooner et al. | 6,473,001 B1 | 10/2002 | Blum |
| 6,320,176 B1 | 11/2001 | Schofield et al. | 6,474,853 B2 | 11/2002 | Pastrick et al. |
| 6,320,282 B1 * | 11/2001 | Caldwell ........................ 307/125 | 6,476,731 B1 | 11/2002 | Miki et al. |
| 6,320,612 B1 | 11/2001 | Young | 6,477,460 B2 | 11/2002 | Kepler |
| 6,324,295 B1 | 11/2001 | Valery et al. | 6,477,464 B2 | 11/2002 | McCarthy et al. |
| 6,326,613 B1 | 12/2001 | Heslin et al. | 6,483,429 B1 | 11/2002 | Yasui et al. |
| 6,326,900 B2 | 12/2001 | DeLine et al. | 6,483,438 B2 | 11/2002 | DeLine et al. |
| 6,329,925 B1 | 12/2001 | Skiver et al. | 6,487,500 B2 | 11/2002 | Lemelson et al. |
| 6,330,511 B2 | 12/2001 | Ogura et al. | 6,494,602 B2 | 12/2002 | Pastrick et al. |
| 6,331,066 B1 | 12/2001 | Desmond et al. | 6,498,620 B2 | 12/2002 | Schofield et al. |
| 6,333,759 B1 | 12/2001 | Mazzilli | 6,501,387 B2 | 12/2002 | Skiver et al. |
| 6,335,680 B1 | 1/2002 | Matsuoka | 6,512,203 B2 * | 1/2003 | Jones et al. ................... 219/219 |
| 6,336,737 B1 | 1/2002 | Thau | 6,512,624 B2 | 1/2003 | Tonar et al. |
| 6,340,849 B1 | 1/2002 | Kramer | 6,513,252 B1 | 2/2003 | Schierbeek et al. |
| 6,340,850 B2 | 1/2002 | O'Farrell et al. | 6,515,581 B1 | 2/2003 | Ho |
| 6,344,805 B1 | 2/2002 | Yasui et al. | 6,515,597 B1 | 2/2003 | Wada et al. |
| 6,346,698 B1 | 2/2002 | Turnbull | 6,519,209 B1 | 2/2003 | Arikawa et al. |
| 6,347,880 B1 | 2/2002 | Fürst et al. | 6,520,667 B1 | 2/2003 | Mousseau |
| 6,348,858 B2 | 2/2002 | Weis et al. | 6,522,451 B1 | 2/2003 | Lynam |
| 6,353,392 B1 | 3/2002 | Schofield et al. | 6,522,969 B2 | 2/2003 | Kannonji |
| 6,356,206 B1 | 3/2002 | Takenaga et al. | 6,525,707 B1 | 2/2003 | Kaneko et al. |
| 6,356,376 B1 | 3/2002 | Tonar et al. | 6,538,709 B1 | 3/2003 | Kurihara et al. |
| 6,356,389 B1 | 3/2002 | Nilsen et al. | 6,539,306 B2 | 3/2003 | Turnbull |
| 6,357,883 B1 | 3/2002 | Strumolo et al. | 6,542,085 B1 | 4/2003 | Yang |
| 6,362,121 B1 | 3/2002 | Chopin et al. | 6,542,182 B1 | 4/2003 | Chutorash |
| 6,362,548 B1 | 3/2002 | Bingle et al. | 6,543,163 B1 | 4/2003 | Ginsberg |
| 6,363,326 B1 | 3/2002 | Scully | 6,545,598 B1 | 4/2003 | de Villeroche |
| 6,366,013 B1 | 4/2002 | Leenders et al. | 6,549,253 B1 | 4/2003 | Robbie et al. |
| 6,366,213 B2 | 4/2002 | DeLine et al. | 6,549,335 B1 | 4/2003 | Trapani et al. |
| 6,370,329 B1 | 4/2002 | Teuchert | 6,550,949 B1 | 4/2003 | Bauer et al. |
| 6,371,636 B1 | 4/2002 | Wesson | 6,552,326 B2 | 4/2003 | Turnbull |
| 6,379,013 B1 | 4/2002 | Bechtel et al. | 6,553,308 B1 | 4/2003 | Uhlmann et al. |
| 6,379,788 B2 | 4/2002 | Choi et al. | 6,559,902 B1 | 5/2003 | Kusuda et al. |
| 6,382,805 B1 | 5/2002 | Miyabukuro | 6,560,027 B2 | 5/2003 | Meine |
| 6,385,139 B1 | 5/2002 | Arikawa et al. | 6,566,821 B2 | 5/2003 | Nakatsuka et al. |
| 6,386,742 B1 | 5/2002 | DeLine et al. | 6,567,060 B1 | 5/2003 | Sekiguchi |
| 6,390,529 B1 | 5/2002 | Bingle et al. | 6,568,839 B1 | 5/2003 | Pastrick et al. |
| 6,390,635 B2 | 5/2002 | Whitehead et al. | 6,572,233 B1 | 6/2003 | Northman et al. |
| 6,396,397 B1 | 5/2002 | Bos et al. | 6,573,957 B1 | 6/2003 | Suzuki |
| 6,396,637 B2 | 5/2002 | Roest et al. | 6,573,963 B2 | 6/2003 | Ouderkirk et al. |
| 6,407,847 B1 | 6/2002 | Poll et al. | 6,575,643 B2 | 6/2003 | Takahashi |
| 6,408,247 B1 | 6/2002 | Ichikawa et al. | 6,580,373 B1 | 6/2003 | Ohashi |
| 6,411,204 B1 | 6/2002 | Bloomfield et al. | 6,580,479 B1 | 6/2003 | Sekiguchi et al. |
| 6,412,959 B1 | 7/2002 | Tseng | 6,580,562 B2 | 6/2003 | Aoki et al. |
| 6,412,973 B1 | 7/2002 | Bos et al. | 6,581,007 B2 | 6/2003 | Hasegawa et al. |
| 6,414,910 B1 | 7/2002 | Kaneko et al. | 6,583,730 B2 | 6/2003 | Lang et al. |
| 6,415,230 B1 | 7/2002 | Maruko et al. | 6,591,192 B2 | 7/2003 | Okamura et al. |
| 6,416,208 B2 | 7/2002 | Pastrick et al. | 6,592,230 B2 | 7/2003 | Dupay |
| 6,418,376 B1 | 7/2002 | Olson | 6,593,984 B2 | 7/2003 | Arakawa et al. |
| 6,419,300 B1 | 7/2002 | Pavao et al. | 6,594,065 B2 | 7/2003 | Byker et al. |
| 6,420,036 B1 | 7/2002 | Varaprasad et al. | 6,594,067 B2 | 7/2003 | Poll et al. |
| 6,420,800 B1 | 7/2002 | LeVesque et al. | 6,594,090 B2 | 7/2003 | Kruschwitz et al. |

| | | |
|---|---|---|
| 6,594,583 B2 | 7/2003 | Ogura et al. |
| 6,594,614 B2 | 7/2003 | Studt et al. |
| 6,597,489 B1 | 7/2003 | Guarr et al. |
| 6,606,183 B2 | 8/2003 | Ikai et al. |
| 6,611,202 B2 | 8/2003 | Schofield et al. |
| 6,611,227 B1 | 8/2003 | Nebiyeloul-Kifle |
| 6,611,759 B2 | 8/2003 | Brosche |
| 6,614,387 B1 | 9/2003 | Deadman |
| 6,614,579 B2 | 9/2003 | Roberts et al. |
| 6,616,313 B2 | 9/2003 | Fürst et al. |
| 6,616,764 B2 | 9/2003 | Krämer |
| 6,618,672 B2 | 9/2003 | Sasaki et al. |
| 6,621,616 B1 | 9/2003 | Bauer et al. |
| 6,624,936 B2 | 9/2003 | Kotchick et al. |
| 6,627,918 B2 | 9/2003 | Getz et al. |
| 6,630,888 B2 | 10/2003 | Lang et al. |
| 6,636,190 B2 | 10/2003 | Hirakata et al. |
| 6,636,258 B2 | 10/2003 | Strumolo |
| 6,638,582 B1 | 10/2003 | Uchiyama et al. |
| 6,639,360 B2 | 10/2003 | Roberts et al. |
| 6,642,840 B2 | 11/2003 | Lang et al. |
| 6,642,851 B2 | 11/2003 | DeLine et al. |
| 6,646,697 B1 | 11/2003 | Sekiguchi et al. |
| 6,648,477 B2 | 11/2003 | Hutzel et al. |
| 6,650,457 B2 | 11/2003 | Busscher et al. |
| 6,661,482 B2 | 12/2003 | Hara |
| 6,661,830 B1 | 12/2003 | Reed et al. |
| 6,665,592 B2 | 12/2003 | Kodama |
| 6,669,285 B1 | 12/2003 | Park et al. |
| 6,670,207 B1 | 12/2003 | Roberts |
| 6,670,910 B2 | 12/2003 | Delcheccolo et al. |
| 6,670,941 B2 | 12/2003 | Albu et al. |
| 6,671,080 B2 | 12/2003 | Poll et al. |
| 6,672,734 B2 | 1/2004 | Lammers |
| 6,672,744 B2 | 1/2004 | DeLine et al. |
| 6,672,745 B1 | 1/2004 | Bauer et al. |
| 6,674,370 B2 | 1/2004 | Rodewald et al. |
| 6,675,075 B1 | 1/2004 | Engelsberg et al. |
| 6,678,083 B1 | 1/2004 | Anstee |
| 6,678,614 B2 | 1/2004 | McCarthy et al. |
| 6,679,608 B2 | 1/2004 | Bechtel et al. |
| 6,683,539 B2 | 1/2004 | Trajkovic et al. |
| 6,683,969 B1 | 1/2004 | Nishigaki et al. |
| 6,685,348 B2 | 2/2004 | Pastrick et al. |
| 6,690,262 B1 | 2/2004 | Winnett |
| 6,690,268 B2 | 2/2004 | Schofield et al. |
| 6,690,413 B1 | 2/2004 | Moore |
| 6,690,438 B2 | 2/2004 | Sekiguchi |
| 6,693,517 B2 | 2/2004 | McCarthy et al. |
| 6,693,518 B2 | 2/2004 | Kumata |
| 6,693,519 B2 | 2/2004 | Keirstead |
| 6,693,524 B1 | 2/2004 | Payne |
| 6,700,692 B2 | 3/2004 | Tonar et al. |
| 6,709,136 B2 | 3/2004 | Pastrick et al. |
| 6,713,783 B1 | 3/2004 | Mase et al. |
| 6,717,109 B1 | 4/2004 | Macher et al. |
| 6,717,610 B1 | 4/2004 | Bos et al. |
| 6,717,712 B2 | 4/2004 | Lynam et al. |
| 6,724,446 B2 | 4/2004 | Motomura et al. |
| 6,726,337 B2 | 4/2004 | Whitehead et al. |
| 6,727,807 B2 | 4/2004 | Trajkovic et al. |
| 6,727,808 B1 | 4/2004 | Uselmann et al. |
| 6,727,844 B1 | 4/2004 | Zimmermann et al. |
| 6,731,332 B1 | 5/2004 | Yasui et al. |
| 6,734,807 B2 | 5/2004 | King |
| 6,736,526 B2 | 5/2004 | Matsuba et al. |
| 6,737,629 B2 | 5/2004 | Nixon et al. |
| 6,737,630 B2 | 5/2004 | Turnbull |
| 6,737,964 B2 | 5/2004 | Samman et al. |
| 6,738,088 B1 | 5/2004 | Uskolovsky et al. |
| 6,744,353 B2 | 6/2004 | Sjönell |
| 6,746,775 B1 | 6/2004 | Boire et al. |
| 6,747,716 B2 | 6/2004 | Kuroiwa et al. |
| 6,748,211 B1 | 6/2004 | Isaac et al. |
| 6,749,308 B1 | 6/2004 | Niendorf et al. |
| 6,755,542 B2 | 6/2004 | Bechtel et al. |
| 6,756,912 B2 | 6/2004 | Skiver et al. |
| 6,757,109 B2 | 6/2004 | Bos |
| 6,759,113 B1 | 7/2004 | Tang |
| 6,759,945 B2 | 7/2004 | Richard |
| 6,760,157 B1 | 7/2004 | Allen et al. |
| 6,773,116 B2 | 8/2004 | De Vaan et al. |
| 6,778,904 B2 | 8/2004 | Iwami et al. |
| 6,779,900 B1 | 8/2004 | Nolan-Brown |
| 6,797,396 B1 | 9/2004 | Liu et al. |
| 6,800,871 B2 | 10/2004 | Matsuda et al. |
| 6,801,283 B2 | 10/2004 | Koyama et al. |
| 6,805,474 B2 | 10/2004 | Walser et al. |
| 6,806,452 B2 | 10/2004 | Bos et al. |
| 6,810,323 B1 | 10/2004 | Bullock et al. |
| 6,819,231 B2 | 11/2004 | Berberich et al. |
| 6,824,281 B2 | 11/2004 | Schofield et al. |
| 6,831,268 B2 | 12/2004 | Bechtel et al. |
| 6,832,848 B2 | 12/2004 | Pastrick |
| 6,834,969 B2 | 12/2004 | Bade et al. |
| 6,836,725 B2 | 12/2004 | Millington et al. |
| 6,842,276 B2 | 1/2005 | Poll et al. |
| 6,845,805 B1 | 1/2005 | Köster |
| 6,846,098 B2 | 1/2005 | Bourdelais et al. |
| 6,847,424 B2 | 1/2005 | Gotoh et al. |
| 6,847,487 B2 | 1/2005 | Burgner |
| 6,848,817 B2 | 2/2005 | Bos et al. |
| 6,849,165 B2 | 2/2005 | Klöppel et al. |
| 6,853,491 B1 | 2/2005 | Ruhle et al. |
| 6,855,431 B2 | 2/2005 | Varaprasad et al. |
| 6,870,655 B1 | 3/2005 | Northman et al. |
| 6,870,656 B2 | 3/2005 | Tonar et al. |
| 6,871,982 B2 | 3/2005 | Holman et al. |
| 6,882,287 B2 | 4/2005 | Schofield |
| 6,889,064 B2 | 5/2005 | Baratono et al. |
| 6,902,284 B2 | 6/2005 | Hutzel et al. |
| 6,910,779 B2 | 6/2005 | Abel et al. |
| 6,912,396 B2 | 6/2005 | Sziraki et al. |
| 6,916,099 B2 | 7/2005 | Su et al. |
| 6,928,180 B2 | 8/2005 | Stam et al. |
| 6,928,366 B2 | 8/2005 | Ockerse et al. |
| 6,930,737 B2 | 8/2005 | Weindorf et al. |
| 6,934,067 B2 | 8/2005 | Ash et al. |
| 6,946,978 B2 | 9/2005 | Schofield |
| 6,947,576 B2 | 9/2005 | Stam et al. |
| 6,947,577 B2 | 9/2005 | Stam et al. |
| 6,951,410 B2 | 10/2005 | Parsons |
| 6,951,681 B2 | 10/2005 | Hartley et al. |
| 6,952,312 B2 | 10/2005 | Weber et al. |
| 6,958,495 B2 | 10/2005 | Nishijima et al. |
| 6,958,683 B2 | 10/2005 | Mills et al. |
| 6,961,178 B2 | 11/2005 | Sugino et al. |
| 6,963,438 B2 | 11/2005 | Busscher et al. |
| 6,972,888 B2 | 12/2005 | Poll et al. |
| 6,974,236 B2 | 12/2005 | Tenmyo |
| 6,975,215 B2 | 12/2005 | Schofield et al. |
| 6,977,702 B2 | 12/2005 | Wu |
| 6,985,291 B2 | 1/2006 | Watson et al. |
| 6,992,718 B1 | 1/2006 | Takahara |
| 7,001,058 B2 | 2/2006 | Inditsky |
| 7,004,592 B2 | 2/2006 | Varaprasad et al. |
| 7,004,593 B2 | 2/2006 | Weller et al. |
| 7,006,173 B1 | 2/2006 | Hiyama et al. |
| 7,009,751 B2 | 3/2006 | Tonar et al. |
| 7,042,616 B2 | 5/2006 | Tonar et al. |
| 7,046,418 B2 | 5/2006 | Lin et al. |
| 7,046,448 B2 | 5/2006 | Burgner |
| 7,057,681 B2 | 6/2006 | Hinata et al. |
| 7,063,893 B2 | 6/2006 | Hoffman |
| 7,064,882 B2 | 6/2006 | Tonar et al. |
| 7,074,486 B2 | 7/2006 | Boire et al. |
| 7,081,810 B2 | 7/2006 | Henderson et al. |
| 7,092,052 B2 | 8/2006 | Okamoto et al. |
| 7,106,213 B2 | 9/2006 | White |
| 7,121,028 B2 | 10/2006 | Shoen et al. |
| 7,125,131 B2 | 10/2006 | Olczak |
| 7,130,727 B2 | 10/2006 | Liu et al. |
| 7,132,064 B2 | 11/2006 | Li et al. |
| 7,136,091 B2 | 11/2006 | Ichikawa et al. |
| 7,138,974 B2 | 11/2006 | Hirakata et al. |
| 7,151,515 B2 | 12/2006 | Kim et al. |
| 7,151,997 B2 | 12/2006 | Uhlmann et al. |
| 7,153,588 B2 | 12/2006 | McMan et al. |

| Patent No. | Date | Inventor |
|---|---|---|
| 7,154,657 B2 | 12/2006 | Poll et al. |
| 7,160,017 B2 | 1/2007 | Lee et al. |
| 7,167,796 B2 | 1/2007 | Taylor et al. |
| 7,175,291 B1 | 2/2007 | Li |
| 7,176,790 B2 | 2/2007 | Yamazaki |
| 7,184,190 B2 | 2/2007 | McCabe et al. |
| 7,187,498 B2 | 3/2007 | Bengoechea et al. |
| 7,188,963 B2 | 3/2007 | Schofield et al. |
| 7,193,764 B2 | 3/2007 | Lin et al. |
| 7,195,381 B2 | 3/2007 | Lynam et al. |
| 7,202,987 B2 | 4/2007 | Varaprasad et al. |
| 7,206,697 B2 | 4/2007 | Olney et al. |
| 7,209,277 B2 | 4/2007 | Tonar et al. |
| 7,215,473 B2 | 5/2007 | Fleming |
| 7,221,363 B2 | 5/2007 | Roberts et al. |
| 7,224,324 B2 | 5/2007 | Quist et al. |
| 7,230,523 B2 | 6/2007 | Harter, Jr. et al. |
| 7,232,231 B2 | 6/2007 | Shih |
| 7,233,304 B1 | 6/2007 | Aratani et al. |
| 7,235,918 B2 | 6/2007 | McCullough et al. |
| 7,241,037 B2 | 7/2007 | Mathieu et al. |
| 7,245,207 B1 | 7/2007 | Dayan et al. |
| 7,245,336 B2 | 7/2007 | Hiyama et al. |
| 7,248,305 B2 | 7/2007 | Ootsuta et al. |
| 7,251,079 B2 | 7/2007 | Capaldo et al. |
| 7,255,451 B2 | 8/2007 | McCabe et al. |
| 7,262,916 B2 | 8/2007 | Kao et al. |
| 7,268,841 B2 | 9/2007 | Kasajima et al. |
| 7,269,327 B2 | 9/2007 | Tang |
| 7,269,328 B2 | 9/2007 | Tang |
| 7,271,951 B2 | 9/2007 | Weber et al. |
| 7,274,501 B2 | 9/2007 | McCabe et al. |
| 7,281,491 B2 | 10/2007 | Iwamaru |
| 7,286,280 B2 | 10/2007 | Whitehead et al. |
| 7,287,868 B2 | 10/2007 | Carter et al. |
| 7,290,919 B2 | 11/2007 | Pan et al. |
| 7,292,208 B1 | 11/2007 | Park et al. |
| 7,310,177 B2 | 12/2007 | McCabe et al. |
| 7,316,485 B2 | 1/2008 | Roose |
| 7,323,819 B2 | 1/2008 | Hong et al. |
| 7,324,261 B2 | 1/2008 | Tonar et al. |
| 7,327,225 B2 | 2/2008 | Nicholas et al. |
| 7,327,226 B2 | 2/2008 | Turnbull et al. |
| 7,327,855 B1 | 2/2008 | Chen |
| 7,328,103 B2 | 2/2008 | McCarthy et al. |
| 7,338,177 B2 | 3/2008 | Lynam |
| 7,344,284 B2 | 3/2008 | Lynam et al. |
| 7,349,143 B2 | 3/2008 | Tonar et al. |
| 7,362,505 B2 | 4/2008 | Hikmet et al. |
| 7,370,983 B2 | 5/2008 | DeWind et al. |
| 7,372,611 B2 | 5/2008 | Tonar et al. |
| 7,375,895 B2 | 5/2008 | Brynielsson |
| 7,379,224 B2 | 5/2008 | Tonar et al. |
| 7,379,225 B2 | 5/2008 | Tonar et al. |
| 7,379,243 B2 | 5/2008 | Horsten et al. |
| 7,379,814 B2 | 5/2008 | Ockerse et al. |
| 7,389,171 B2 | 6/2008 | Rupp |
| 7,396,147 B2 | 7/2008 | Munro |
| 7,411,732 B2 | 8/2008 | Kao et al. |
| 7,417,781 B2 | 8/2008 | Tonar et al. |
| 7,446,462 B2 | 11/2008 | Lim et al. |
| 7,446,650 B2 | 11/2008 | Scholfield et al. |
| 7,446,924 B2 | 11/2008 | Schofield et al. |
| 7,448,776 B2 | 11/2008 | Tang |
| 7,455,412 B2 | 11/2008 | Rottcher |
| 7,460,007 B2 | 12/2008 | Schofield et al. |
| 7,471,438 B2 | 12/2008 | McCabe et al. |
| 7,477,439 B2 | 1/2009 | Tonar et al. |
| 7,480,149 B2 | 1/2009 | DeWard et al. |
| 7,489,374 B2 | 2/2009 | Utsumi et al. |
| 7,490,007 B2 | 2/2009 | Taylor et al. |
| 7,490,943 B2 | 2/2009 | Kikuchi et al. |
| 7,494,231 B2 | 2/2009 | Varaprasad et al. |
| 7,495,719 B2 | 2/2009 | Adachi et al. |
| 7,496,439 B2 | 2/2009 | McCormick |
| 7,502,156 B2 | 3/2009 | Tonar et al. |
| 7,505,188 B2 | 3/2009 | Niiyama et al. |
| 7,511,607 B2 | 3/2009 | Hubbard et al. |
| 7,511,872 B2 | 3/2009 | Tonar et al. |
| 7,526,103 B2 | 4/2009 | Schofield et al. |
| 7,540,620 B2 | 6/2009 | Weller et al. |
| 7,541,570 B2 | 6/2009 | Drummond et al. |
| 7,547,467 B2 | 6/2009 | Olson et al. |
| 7,548,291 B2 | 6/2009 | Lee et al. |
| 7,551,354 B2 | 6/2009 | Horsten et al. |
| 7,562,985 B2 | 7/2009 | Cortenraad et al. |
| 7,567,291 B2 | 7/2009 | Bechtel et al. |
| 7,571,038 B2 | 8/2009 | Butler et al. |
| 7,572,490 B2 | 8/2009 | Park et al. |
| 7,581,867 B2 | 9/2009 | Lee et al. |
| 7,586,566 B2 | 9/2009 | Nelson et al. |
| 7,586,666 B2 | 9/2009 | McCabe et al. |
| 7,589,893 B2 | 9/2009 | Rottcher |
| 7,619,508 B2 | 11/2009 | Lynam et al. |
| 7,623,202 B2 | 11/2009 | Araki et al. |
| 7,626,749 B2 | 12/2009 | Baur et al. |
| 7,633,567 B2 | 12/2009 | Yamada et al. |
| 7,636,188 B2 | 12/2009 | Baur et al. |
| 7,636,195 B2 | 12/2009 | Nieuwkerk et al. |
| 7,636,930 B2 | 12/2009 | Chang |
| 7,643,927 B2 | 1/2010 | Hils |
| 7,688,495 B2 | 3/2010 | Tonar et al. |
| 7,695,174 B2 | 4/2010 | Takayanagi et al. |
| 7,696,964 B2 | 4/2010 | Lankhorst et al. |
| 7,706,046 B2 | 4/2010 | Bauer et al. |
| 7,746,534 B2 | 6/2010 | Tonar et al. |
| 7,787,077 B2 | 8/2010 | Kondoh et al. |
| 7,791,694 B2 | 9/2010 | Molsen et al. |
| 7,830,583 B2 | 11/2010 | Neuman et al. |
| 7,842,154 B2 | 11/2010 | Lynam |
| 2001/0008458 A1 | 7/2001 | Asano et al. |
| 2001/0030857 A1 | 10/2001 | Futhey et al. |
| 2001/0045981 A1 | 11/2001 | Gloger et al. |
| 2002/0003571 A1 | 1/2002 | Schofield et al. |
| 2002/0044065 A1 | 4/2002 | Quist et al. |
| 2002/0049535 A1 | 4/2002 | Rigo et al. |
| 2002/0072026 A1 | 6/2002 | Lynam et al. |
| 2002/0085155 A1 | 7/2002 | Arikawa |
| 2002/0092958 A1 | 7/2002 | Lusk |
| 2002/0093826 A1 | 7/2002 | Bos et al. |
| 2002/0118321 A1 | 8/2002 | Ge |
| 2002/0126497 A1 | 9/2002 | Pastrick |
| 2002/0133144 A1 | 9/2002 | Chan et al. |
| 2002/0149727 A1 | 10/2002 | Wang |
| 2002/0154007 A1 | 10/2002 | Yang |
| 2002/0159270 A1 | 10/2002 | Lynam et al. |
| 2002/0172053 A1 | 11/2002 | Pastrick et al. |
| 2002/0191409 A1 | 12/2002 | DeLine et al. |
| 2002/0196639 A1 | 12/2002 | Weidel |
| 2003/0002165 A1 | 1/2003 | Mathias et al. |
| 2003/0007261 A1 | 1/2003 | Hutzel et al. |
| 2003/0016125 A1 | 1/2003 | Lang et al. |
| 2003/0016287 A1 | 1/2003 | Nakayama et al. |
| 2003/0016543 A1 | 1/2003 | Akiyama |
| 2003/0020603 A1 | 1/2003 | DeLine et al. |
| 2003/0025596 A1 | 2/2003 | Lang et al. |
| 2003/0025597 A1 | 2/2003 | Schofield |
| 2003/0030546 A1 | 2/2003 | Tseng |
| 2003/0030551 A1 | 2/2003 | Ho |
| 2003/0030724 A1 | 2/2003 | Okamoto |
| 2003/0035050 A1 | 2/2003 | Mizusawa |
| 2003/0043269 A1 | 3/2003 | Park |
| 2003/0043589 A1 | 3/2003 | Blank |
| 2003/0048639 A1 | 3/2003 | Boyd et al. |
| 2003/0052969 A1 | 3/2003 | Satoh et al. |
| 2003/0058338 A1 | 3/2003 | Kawauchi et al. |
| 2003/0067383 A1 | 4/2003 | Yang |
| 2003/0069690 A1 | 4/2003 | Correia et al. |
| 2003/0076415 A1 | 4/2003 | Strumolo |
| 2003/0080877 A1 | 5/2003 | Takagi et al. |
| 2003/0085806 A1 | 5/2003 | Samman et al. |
| 2003/0088361 A1 | 5/2003 | Sekiguchi |
| 2003/0090568 A1 | 5/2003 | Pico |
| 2003/0090569 A1 | 5/2003 | Poechmuller |
| 2003/0090570 A1 | 5/2003 | Takagi et al. |
| 2003/0095331 A1 | 5/2003 | Bengoechea et al. |
| 2003/0098908 A1 | 5/2003 | Misaiji et al. |
| 2003/0103141 A1 | 6/2003 | Bechtel et al. |

| Publication | Date | Name |
|---|---|---|
| 2003/0103142 A1 | 6/2003 | Hitomi et al. |
| 2003/0117522 A1 | 6/2003 | Okada |
| 2003/0122929 A1 | 7/2003 | Minaudo et al. |
| 2003/0122930 A1 | 7/2003 | Schofield et al. |
| 2003/0133014 A1 | 7/2003 | Mendoza |
| 2003/0137586 A1 | 7/2003 | Lewellen |
| 2003/0141965 A1 | 7/2003 | Gunderson et al. |
| 2003/0146831 A1 | 8/2003 | Berberich et al. |
| 2003/0147244 A1 | 8/2003 | Tenmyo |
| 2003/0156193 A1 | 8/2003 | Nakamura |
| 2003/0169158 A1 | 9/2003 | Paul, Jr. |
| 2003/0169522 A1 | 9/2003 | Schofield et al. |
| 2003/0179293 A1 | 9/2003 | Oizumi |
| 2003/0189754 A1 | 10/2003 | Sugino et al. |
| 2003/0202096 A1 | 10/2003 | Kim |
| 2003/0210369 A1 | 11/2003 | Wu |
| 2003/0214576 A1 | 11/2003 | Koga |
| 2003/0214584 A1 | 11/2003 | Ross, Jr. |
| 2003/0214733 A1 | 11/2003 | Fujikawa et al. |
| 2003/0222793 A1 | 12/2003 | Tanaka et al. |
| 2003/0222983 A1 | 12/2003 | Nobori et al. |
| 2003/0227546 A1 | 12/2003 | Hilborn et al. |
| 2004/0004541 A1 | 1/2004 | Hong |
| 2004/0027695 A1 | 2/2004 | Lin |
| 2004/0032321 A1 | 2/2004 | McMahon et al. |
| 2004/0032638 A1 * | 2/2004 | Tonar et al. ............ 359/265 |
| 2004/0032675 A1 | 2/2004 | Weller et al. |
| 2004/0032676 A1 | 2/2004 | Drummond et al. |
| 2004/0036768 A1 | 2/2004 | Green |
| 2004/0046870 A1 | 3/2004 | Leigh Travis |
| 2004/0051634 A1 | 3/2004 | Schofield et al. |
| 2004/0056955 A1 | 3/2004 | Berberich et al. |
| 2004/0057131 A1 | 3/2004 | Hutzel et al. |
| 2004/0061920 A1 | 4/2004 | Tonar et al. |
| 2004/0064241 A1 | 4/2004 | Sekiguchi |
| 2004/0066285 A1 | 4/2004 | Sekiguchi |
| 2004/0075603 A1 | 4/2004 | Kodama |
| 2004/0077359 A1 | 4/2004 | Bernas et al. |
| 2004/0080404 A1 | 4/2004 | White |
| 2004/0080431 A1 | 4/2004 | White |
| 2004/0085196 A1 | 5/2004 | Miller et al. |
| 2004/0085499 A1 | 5/2004 | Baek |
| 2004/0090314 A1 | 5/2004 | Iwamoto |
| 2004/0090317 A1 | 5/2004 | Rothkop |
| 2004/0095632 A1 | 5/2004 | Busscher et al. |
| 2004/0096082 A1 | 5/2004 | Nakai et al. |
| 2004/0098196 A1 | 5/2004 | Sekiguchi |
| 2004/0105614 A1 | 6/2004 | Kobayashi et al. |
| 2004/0107030 A1 | 6/2004 | Nishira et al. |
| 2004/0107617 A1 | 6/2004 | Shoen et al. |
| 2004/0109060 A1 | 6/2004 | Ishii |
| 2004/0114039 A1 | 6/2004 | Ishikura |
| 2004/0128065 A1 | 7/2004 | Taylor et al. |
| 2004/0145457 A1 | 7/2004 | Schofield et al. |
| 2004/0170008 A1 | 9/2004 | Tenmyo |
| 2004/0196577 A1 | 10/2004 | Carter et al. |
| 2004/0202001 A1 | 10/2004 | Roberts et al. |
| 2004/0243303 A1 | 12/2004 | Padmanabhan |
| 2004/0251804 A1 | 12/2004 | McCullough et al. |
| 2005/0024591 A1 | 2/2005 | Lian et al. |
| 2005/0078347 A1 | 4/2005 | Lin et al. |
| 2005/0078389 A1 | 4/2005 | Kulas et al. |
| 2005/0079326 A1 | 4/2005 | Varaprasad et al. |
| 2005/0083577 A1 | 4/2005 | Varaprasad et al. |
| 2005/0099559 A1 | 5/2005 | Lee et al. |
| 2005/0111070 A1 | 5/2005 | Lin et al. |
| 2005/0117095 A1 | 6/2005 | Ma |
| 2005/0140855 A1 | 6/2005 | Utsumi et al. |
| 2005/0168995 A1 | 8/2005 | Kittelmann et al. |
| 2005/0185278 A1 | 8/2005 | Horsten et al. |
| 2005/0195488 A1 | 9/2005 | McCabe et al. |
| 2005/0237440 A1 | 10/2005 | Sugimura et al. |
| 2005/0259326 A1 | 11/2005 | Weber et al. |
| 2005/0270766 A1 | 12/2005 | Kung et al. |
| 2005/0270798 A1 | 12/2005 | Lee et al. |
| 2006/0001641 A1 | 1/2006 | Degwekar et al. |
| 2006/0007550 A1 | 1/2006 | Tonar et al. |
| 2006/0028730 A1 | 2/2006 | Varaprasad et al. |
| 2006/0050018 A1 | 3/2006 | Hutzel et al. |
| 2006/0076860 A1 | 4/2006 | Hoss |
| 2006/0139953 A1 | 6/2006 | Chou et al. |
| 2006/0164230 A1 | 7/2006 | DeWind et al. |
| 2006/0164725 A1 | 7/2006 | Horsten et al. |
| 2006/0171704 A1 | 8/2006 | Bingle et al. |
| 2006/0274218 A1 | 12/2006 | Xue |
| 2007/0041096 A1 | 2/2007 | Nieuwkerk et al. |
| 2007/0058257 A1 | 3/2007 | Lynam |
| 2007/0064108 A1 | 3/2007 | Haler |
| 2007/0080585 A1 | 4/2007 | Lyu |
| 2007/0118287 A1 | 5/2007 | Taylor et al. |
| 2007/0132567 A1 | 6/2007 | Schofield et al. |
| 2007/0162229 A1 | 7/2007 | McCarthy et al. |
| 2007/0171037 A1 | 7/2007 | Schofield et al. |
| 2007/0183066 A1 | 8/2007 | Varaprasad et al. |
| 2007/0184284 A1 | 8/2007 | Varaprasad et al. |
| 2007/0201122 A1 | 8/2007 | Dozeman et al. |
| 2007/0262732 A1 | 11/2007 | Shen |
| 2008/0002106 A1 | 1/2008 | Van De Witte et al. |
| 2008/0013153 A1 | 1/2008 | McCabe et al. |
| 2008/0030311 A1 | 2/2008 | Dayan et al. |
| 2008/0068520 A1 | 3/2008 | Minikey, Jr. et al. |
| 2008/0077882 A1 | 3/2008 | Kramer et al. |
| 2008/0094684 A1 | 4/2008 | Varaprasad et al. |
| 2008/0094685 A1 | 4/2008 | Varaprasad et al. |
| 2008/0180529 A1 | 7/2008 | Taylor et al. |
| 2008/0180781 A1 | 7/2008 | Varaprasad et al. |
| 2008/0183355 A1 | 7/2008 | Taylor et al. |
| 2008/0186724 A1 | 8/2008 | Lynam et al. |
| 2008/0201075 A1 | 8/2008 | Taylor et al. |
| 2008/0212189 A1 | 9/2008 | Baur et al. |
| 2008/0212215 A1 | 9/2008 | Schofield et al. |
| 2008/0225538 A1 | 9/2008 | Lynam et al. |
| 2008/0266389 A1 | 10/2008 | DeWind et al. |
| 2008/0291522 A1 | 11/2008 | Varaprasad et al. |
| 2008/0308219 A1 | 12/2008 | Lynam |
| 2009/0002491 A1 | 1/2009 | Haler |
| 2009/0015736 A1 | 1/2009 | Weller et al. |
| 2009/0033837 A1 | 2/2009 | Molsen et al. |
| 2009/0040465 A1 | 2/2009 | Conner et al. |
| 2009/0040588 A1 | 2/2009 | Tonar et al. |
| 2009/0040778 A1 | 2/2009 | Takayanazi et al. |
| 2009/0052003 A1 | 2/2009 | Schofield et al. |
| 2009/0080055 A1 | 3/2009 | Baur et al. |
| 2009/0085729 A1 | 4/2009 | Nakamura et al. |
| 2009/0096937 A1 | 4/2009 | Bauer et al. |
| 2009/0174776 A1 | 7/2009 | McCarthy et al. |
| 2009/0184904 A1 | 7/2009 | S. et al. |
| 2009/0201137 A1 | 8/2009 | Weller et al. |
| 2009/0243824 A1 | 10/2009 | Peterson et al. |
| 2009/0244740 A1 | 10/2009 | Takayanagi et al. |
| 2009/0262422 A1 | 10/2009 | Cross et al. |
| 2009/0296190 A1 | 12/2009 | Anderson et al. |
| 2010/0045899 A1 | 2/2010 | Ockerse |
| 2010/0110553 A1 | 5/2010 | Anderson et al. |
| 2010/0165437 A1 | 7/2010 | Tonar et al. |
| 2010/0201896 A1 | 8/2010 | Ostreko et al. |
| 2010/0214662 A1 | 8/2010 | Takayanagi et al. |
| 2010/0245701 A1 | 9/2010 | Sato et al. |
| 2010/0277786 A1 | 11/2010 | Anderson et al. |

FOREIGN PATENT DOCUMENTS

| | | |
|---|---|---|
| CA | 2028461 | 11/1994 |
| CN | 1189224 | 7/1998 |
| DE | 3301945 | 7/1984 |
| DE | 3614882 | 11/1987 |
| DE | 19741896 | 4/1999 |
| DE | 19934999 | 2/2001 |
| DE | 19943355 | 3/2001 |
| DE | 20118868 | 3/2002 |
| DE | 10131459 | 1/2003 |
| EP | 0115394 | 8/1984 |
| EP | 0145337 | 6/1985 |
| EP | 0165817 | 12/1985 |
| EP | 0240226 | 10/1987 |
| EP | 0240226 A2 | 10/1987 |
| EP | 0450162 | 12/1990 |
| EP | 0254435 B1 | 5/1992 |
| EP | 0524766 | 1/1993 |

| | | |
|---|---|---|
| EP | 0531143 A2 | 3/1993 |
| EP | 0299509 | 6/1994 |
| EP | 612826 | 8/1994 |
| EP | 0729864 | 12/1995 |
| EP | 0728618 A2 | 8/1996 |
| EP | 0769419 A2 | 4/1997 |
| EP | 0825477 | 2/1998 |
| EP | 0830985 | 3/1998 |
| EP | 1075986 | 2/2001 |
| EP | 1152285 | 11/2001 |
| EP | 1256833 | 11/2002 |
| EP | 1376207 | 1/2004 |
| EP | 2008869 | 12/2008 |
| FR | 2 759 045 | 8/1998 |
| GB | 810010 | 3/1959 |
| GB | 1008411 | 10/1965 |
| GB | 1136134 | 12/1968 |
| GB | 2161440 | 1/1986 |
| GB | 2210836 | 6/1989 |
| GB | 2351055 | 12/2000 |
| GB | 2362494 | 11/2001 |
| JP | 52-10745 | 1/1977 |
| JP | 52-146988 | 11/1977 |
| JP | 57030639 | 2/1982 |
| JP | 57208530 | 12/1982 |
| JP | 5830729 | 2/1983 |
| JP | 59-114139 | 7/1984 |
| JP | 60212730 | 10/1985 |
| JP | 61260217 | 11/1986 |
| JP | 63-262624 | 4/1987 |
| JP | 63-02753 | 1/1988 |
| JP | 63-24225 | 2/1988 |
| JP | 63106730 | 5/1988 |
| JP | 63106731 | 5/1988 |
| JP | 63-274286 | 11/1988 |
| JP | 64-14700 | 1/1989 |
| JP | 1-33535 | 2/1989 |
| JP | 1-230608 | 9/1989 |
| JP | 03-28947 | 3/1991 |
| JP | 03-052097 | 3/1991 |
| JP | 03-110855 | 5/1991 |
| JP | 03243914 | 10/1991 |
| JP | 4-114587 | 4/1992 |
| JP | 5-213113 | 8/1993 |
| JP | 05-257142 | 10/1993 |
| JP | 07-175035 | 7/1995 |
| JP | 07-266928 | 10/1995 |
| JP | 07-281185 | 10/1995 |
| JP | 08-008083 | 1/1996 |
| JP | 08-083581 | 3/1996 |
| JP | 08-216789 | 8/1996 |
| JP | 09-260074 | 3/1997 |
| JP | 09-220976 | 8/1997 |
| JP | 09-266078 | 10/1997 |
| JP | 09-288262 | 11/1997 |
| JP | 10-076880 | 3/1998 |
| JP | 10-199480 | 7/1998 |
| JP | 10-206643 | 8/1998 |
| JP | 11-038381 | 2/1999 |
| JP | 11-067485 | 3/1999 |
| JP | 11078693 | 3/1999 |
| JP | 11-109337 | 4/1999 |
| JP | 11-160539 | 6/1999 |
| JP | 11-212073 | 8/1999 |
| JP | 11-283759 | 10/1999 |
| JP | 11-298058 | 10/1999 |
| JP | 11-305197 | 11/1999 |
| JP | 2000-131681 | 5/2000 |
| JP | 2000-153736 | 6/2000 |
| JP | 2000159014 | 6/2000 |
| JP | 2000255321 | 9/2000 |
| JP | 2000-330107 | 11/2000 |
| JP | 2001-083509 | 3/2001 |
| JP | 2001-222005 | 8/2001 |
| JP | 2002-120649 | 4/2002 |
| JP | 2002-122860 | 4/2002 |
| JP | 2002352611 | 12/2002 |
| JP | 2003267129 | 9/2003 |
| JP | 2004037944 | 2/2004 |
| JP | 2004-182156 | 7/2004 |
| JP | 2005148119 | 6/2005 |
| JP | 2005316509 | 11/2005 |
| JP | 2005327600 | 11/2005 |
| JP | 38-46073 | 11/2006 |
| WO | WO 9530495 A1 | 11/1995 |
| WO | WO 9603475 A1 | 2/1996 |
| WO | WO 9613754 | 5/1996 |
| WO | WO 9734186 A1 | 9/1997 |
| WO | WO 9738350 | 10/1997 |
| WO | WO 9748134 A1 | 12/1997 |
| WO | WO 98/38547 | 9/1998 |
| WO | WO 98/42796 | 10/1998 |
| WO | WO 9844384 A1 | 10/1998 |
| WO | WO 9844385 A1 | 10/1998 |
| WO | WO 9844386 A1 | 10/1998 |
| WO | WO 9914943 A1 | 3/1999 |
| WO | WO 99/15360 | 4/1999 |
| WO | WO 9940039 | 8/1999 |
| WO | WO 9945081 A1 | 9/1999 |
| WO | WO 00/11723 | 3/2000 |
| WO | WO 00/15462 | 3/2000 |
| WO | WO 00/17009 | 3/2000 |
| WO | WO 00/17702 | 3/2000 |
| WO | WO 00/22471 | 4/2000 |
| WO | WO 00/23826 | 4/2000 |
| WO | WO 0018612 | 4/2000 |
| WO | WO 0023826 | 4/2000 |
| WO | WO 0030893 | 6/2000 |
| WO | WO 0033134 A1 | 6/2000 |
| WO | WO 0055685 | 9/2000 |
| WO | WO 0066679 A2 | 11/2000 |
| WO | WO 01/01192 | 1/2001 |
| WO | WO 01/64464 | 9/2001 |
| WO | WO 01/64481 | 9/2001 |
| WO | WO 02/18174 | 3/2002 |
| WO | WO 02/49881 | 6/2002 |
| WO | WO 02/062623 | 8/2002 |
| WO | WO 03/021343 | 3/2003 |
| WO | WO 03/065084 | 8/2003 |
| WO | WO 03/079318 | 9/2003 |
| WO | WO 03103338 A2 | 12/2003 |
| WO | WO 2004/026633 A2 | 4/2004 |
| WO | WO 2004/042457 A3 | 5/2004 |
| WO | WO 2004/058540 | 7/2004 |
| WO | WO 2005/024500 | 3/2005 |
| WO | WO 2005/045481 | 5/2005 |
| WO | WO 2005/050267 | 6/2005 |
| WO | WO 2005/071646 | 8/2005 |
| WO | WO 2005082015 A2 | 9/2005 |
| WO | WO 2007/103573 | 9/2007 |

OTHER PUBLICATIONS

Kobe, Gerry; 42 Volts Goes Underhood; Mar. 2000; Automotive Industries; Cahners Publishing Company; www.findarticles.com/p/articles/mi__m3012/is__3__180/ai__61361677.

Jewett, Dale; Aug. 2000; Automotive Industries; Cahners Publising Company; www.findarticles.com/p/articles/mi__m3012/is_8__180ai__64341779.

National Semiconductor, LM78S40, Universal Switching Regulator Subsystem, National Semiconductor Corporation, Apr. 1996, p. 6.

Examination Report for European Patent Application No. 01916237.9, filed Jul. 30, 2002.

Dana H. Ballard and Christopher M. Brown, Computer Vision, article, 4 pages Prentice-Hall, Englewood Cliffs, New Jersey, believed to be published more than one year prior to the filing date of the present application.

G. Wang, D. Renshaw, P.B. Denyer and M. Lu, CMOS Video Cameras, article, 1991, 4 pages, University of Edinburgh, UK.

European Supplementary Search Report dated Jan. 23, 2006, 3 pages, received from the European Patent Office in connection with European Patent Application No. 03814216.2.

US 5,148,305, 09/1992, Byker (withdrawn)

* cited by examiner

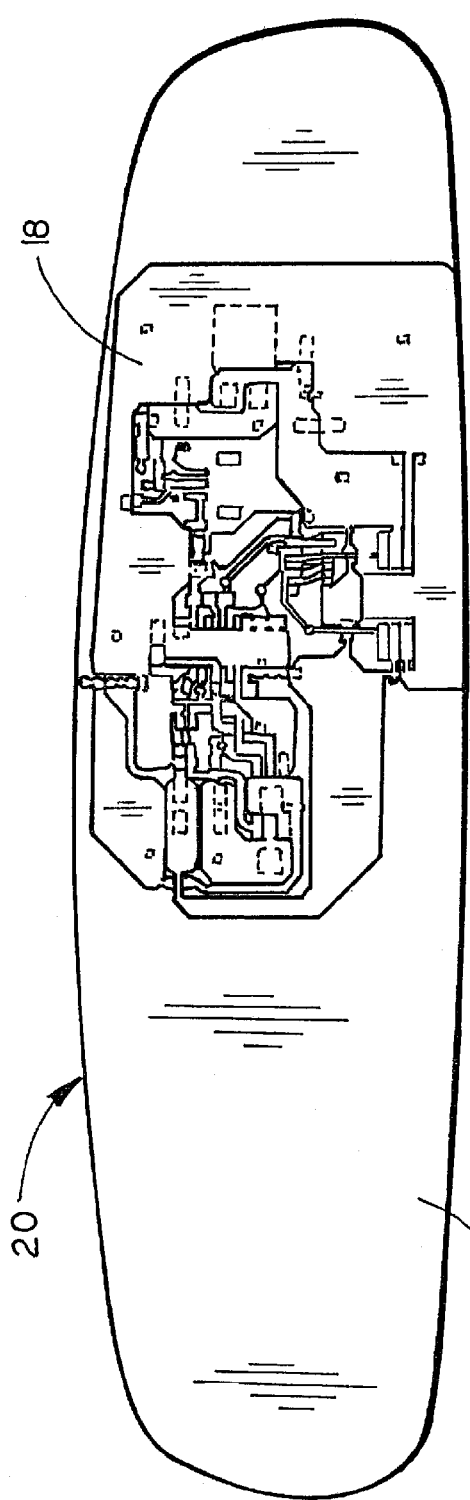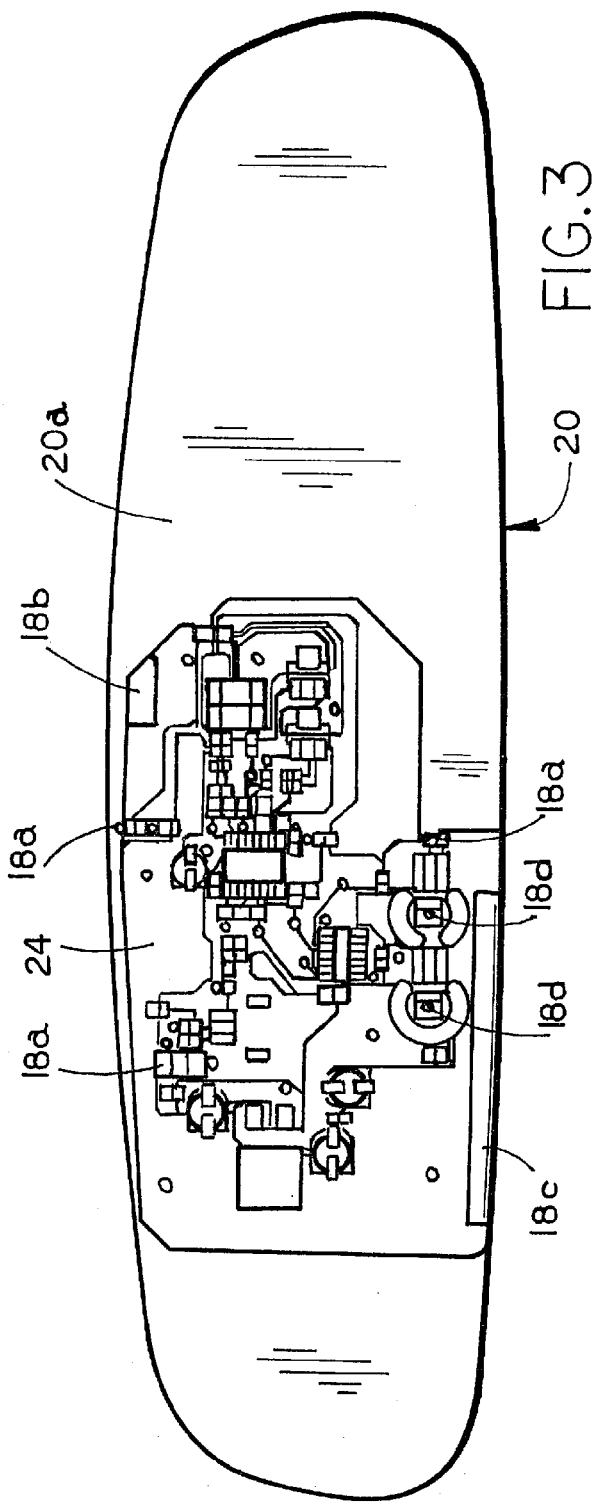

REARVIEW MIRROR ASSEMBLY FOR VEHICLE

CROSS REFERENCE TO RELATED APPLICATIONS

The present application is a continuation of U.S. patent application Ser. No. 12/260,499, filed Oct. 29, 2008, which is a continuation of U.S. patent application Ser. No. 10/956,749, filed Oct. 1, 2004, now U.S. Pat. No. 7,446,924, which claims the benefit of U.S. provisional application Ser. No. 60/508,086, filed Oct. 2, 2003, which are hereby incorporated herein by reference in their entireties.

FIELD OF THE INVENTION

The present invention relates generally to rearview mirror assemblies for vehicles and, more particularly, to rearview mirror assemblies that include one or more electronic components, such as electro-optic or electrochromic interior rearview mirror assemblies. However, aspects of the present invention may be equally suitable for use in prismatic rearview mirror assemblies and/or for exterior rearview mirror assemblies.

BACKGROUND OF THE INVENTION

It is known to attach a printed circuit board to an attachment plate adhered or otherwise affixed to a rear surface of a mirror element, such as an electro-optic reflective element assembly or a prismatic reflective element. In order to attach the printed circuit board to the attachment plate, various connectors or clips may be employed at the attachment plate and/or the circuit board. The attachment plate is typically adhered to the rear surface of the mirror element or substrate, such as via a suitable adhesive or tape or the like. The printed circuit board has a rigid printed board or substrate that is cut or formed to a desired form and has conductive traces and circuitry applied to or placed on or attached to the board. The attachment plate and printed board/substrate include multiple parts and components at the rear of the mirror element, which may be costly to manufacture and assemble. The multiple components also add to the size, weight and volume requirements for the circuit board, which thus may add to the size and weight of the mirror assembly. Also, the printed board or substrate material may add to the weight and to the cost of the mirror assembly.

Therefore, there is a need in the art for an interior rearview mirror assembly that overcomes the shortcomings of the prior art.

SUMMARY OF THE INVENTION

The present invention provides an interior or exterior rearview mirror reflective element assembly that includes a conductive trace and circuitry printed on and/or applied at or to the rear surface of the mirror reflective element assembly, such as to the rear surface of the rear reflective element substrate of an electro-optic or electrochromic mirror reflective element assembly or cell. The circuitry thus may be applied to the existing hard or rigid reflective element substrate (typically glass) of the mirror reflective element assembly, such that the reflective element assembly comprises a circuitry on glass arrangement (although the reflective element substrate may comprise other materials, such as acrylic or polycarbonate or the like, without affecting the scope of the present invention), and does not require the additional printed board or substrate and attachment plate of conventional mirror assemblies. The glass substrate or reflective element substrate of the mirror reflective element assembly thus provides the hard or rigid surface for the conductive trace and electrical components and replaces the hard or rigid printed board or substrate of conventional printed circuit boards. The circuitry on glass assembly of the present invention may be applied to reflective elements or reflective element assemblies of interior mirror assemblies, such as interior rearview mirror assemblies and the like, or of exterior mirror assemblies, such as exterior rearview mirror assemblies and the like, or of other mirror assemblies of vehicles, without affecting the scope of the present invention.

According to an aspect of the present invention, a reflective element assembly for a mirror assembly of a vehicle includes a reflective element substrate (typically glass) having a rear surface (the surface facing generally away from the driver of the vehicle and facing generally forwardly with respect to the direction of travel of the vehicle when the mirror assembly is installed to the vehicle) and a front surface (the surface facing generally toward a driver of the vehicle and generally rearward with respect to the direction of travel of the vehicle when the mirror assembly is installed to the vehicle). The reflective element assembly includes a conductive trace or layer disposed at the rear surface of the reflective element substrate and a non-conductive layer applied to the conductive trace and covering at least some of the conductive trace and leaving at least one portion of the conductive trace exposed. The reflective element assembly includes at least one circuitry component that is applied to at least one of the portions of the conductive trace.

The reflective element substrate may have a reflective layer disposed at one of the front and rear surfaces for viewing by a driver of the vehicle when the mirror assembly is installed to the vehicle. The conductive trace and at least one circuitry component thus are disposed at the rear surface of the existing rigid reflective element substrate (typically glass) that includes or is associated with the reflective surface of the reflective element assembly that is viewable by the driver of the vehicle.

For example, a third surface electro-optic or electrochromic transflective element assembly may include a metallic reflective coating or layer and one or more non-metallic, semi-conductive layers disposed at or on a third surface or front surface of the rear or second reflective element substrate. The rear reflective element substrate of the electrochromic reflective element assembly is positioned rearward of the front reflective element substrate, with an electrochromic medium disposed between the front and rear reflective element substrates. The third surface transflective element assembly thus may provide a reflective surface for viewing by the driver of the vehicle through the front reflective element substrate of the reflective element assembly. Alternately, a fourth surface electro-optic or electrochromic reflective element assembly may have a reflective coating or layer disposed on a fourth or rear surface of the rear reflective element substrate for viewing by a driver of the vehicle through the front and rear reflective element substrates or glass substrates of the reflective element assembly or cell. Alternately, the rear surface of a prismatic element or substrate may have a reflective layer disposed thereon or applied thereto for viewing by the driver of the vehicle.

In any of these embodiments, the conductive trace of the present invention may be applied at the rear surface of the rear reflective element substrate (or the rear surface of the single substrate for prismatic type mirror assemblies) and rearward of the reflective layer or coating so that the conductive trace and electronic components are not viewable by the driver of the vehicle through the reflective element substrate or substrates of the reflective element assembly. In applications where the reflective layer is disposed at the rear or fourth surface of an electro-optic or electrochromic reflective element assembly or cell, an insulating layer may be applied at the rear surface and over the reflective layer or layers, whereby the conductive trace may be applied to the insulating layer. The present invention thus utilizes the existing reflective element substrate of the mirror reflective element assembly as the rigid substrate for receiving the conductive trace and electronic components and/or circuitry.

According to another aspect of the present invention, a method of manufacturing a reflective element assembly for an interior rearview mirror assembly of a vehicle includes providing a reflective element substrate having a front surface and a rear surface. The reflective element substrate has a reflective layer disposed at one of the front and rear surfaces for viewing by a driver of the vehicle when the mirror assembly is installed to the vehicle. A conductive trace or layer is applied to or disposed at the rear surface of the reflective element substrate. A non-conductive layer is applied to the conductive layer to cover at least some of the conductive layer and to leave at least one portion of the conductive layer exposed. At least one circuitry component is applied to the at least one exposed portion of the conductive layer. The conductive trace or layer may comprise a conductive epoxy, such as a conductive silver epoxy or the like, and may be applied in a desired pattern onto the rear surface of the reflective element substrate.

The method may include providing the non-conductive material or layer or mask over portions of the conductive trace while exposing other portions or pads for receiving at least one accessory and/or circuitry component or the like, such as sensors, resistors, capacitors, display elements, and the like, thereon. Optionally, a display element, such as a light emitting diode (LED) display element, a vacuum fluorescent (VF) display element, an electroluminescent (EL) display element, a liquid crystal display (LCD) element, or a video display element or the like, may be integrally formed at the rear surface of the reflective element substrate, such that the display information is viewable through the reflective element substrate. Optionally, at least one proximity sensor or antenna may be applied to or clipped to or attached to or positioned along a portion of the rear surface of the reflective element substrate. The at least one proximity sensor or antenna may be operable to detect a presence of a person's finger at or near the mirror assembly, such as at or near one of the sensors or at or near a corresponding icon on or at the mirror casing or bezel and at which or behind which the proximity sensor is located. The circuitry or component may be operable to actuate a display menu or the like and/or actuate or toggle or control an accessory in response to such a detection.

The accessories or circuitry or electrical components may be applied or adhered to the exposed portions or pads of the conductive trace before the conductive trace has cured, such that the curing of the conductive trace may secure the accessories and the like to the conductive trace, or the accessories or circuitry or components may be adhered or secured to the exposed portions after curing of the conductive trace, without affecting the scope of the present invention.

The mirror reflective element assembly may comprise an electro-optic or electrochromic mirror reflective element assembly or cell having first and second reflective element substrates. The conductive trace may be applied to the fourth or rear surface of the second or rear reflective element substrate of the electrochromic mirror reflective element assembly. The electrochromic mirror reflective element assembly or cell may include clips or busbars extending at least partially along the upper edge of one of the reflective element substrates and the lower edge of the other of the reflective element substrates. The conductive trace may include portions that extend substantially to the upper and lower edges of the second reflective element substrate to facilitate connection to the clips or busbars. The clips or busbars may contact portions of the conductive trace applied to the rear or fourth surface of the rear or second reflective element substrate to connect the busbars to the circuitry or the like associated with or connected to the conductive trace.

Therefore, the interior rearview mirror assembly of the present invention provides a mirror reflective element assembly, such as an electro-optic or electrochromic mirror reflective element assembly or cell or a prismatic reflective element assembly, that includes a conductive trace and circuitry applied to or disposed at a rear surface of a reflective element substrate, such as a rear glass substrate of an electro-optic or electrochromic reflective element assembly or a single glass substrate of a prismatic reflective element assembly or the like, such that at least one electronic component and/or circuitry is integral with the reflective element substrate of the reflective element assembly. The reflective element assembly thus provides a circuitry on glass arrangement and thus utilizes the existing rigid glass reflective element substrate of the reflective element assembly as the rigid surface that receives the conductive trace and circuitry or electronic components thereon. The electronic components and/or circuitry thus are not provided on a separate rigid printed board or substrate that may be snapped onto or otherwise attached to an attachment plate adhered to or otherwise positioned at the rear surface of the reflective element. The rearview mirror reflective element assembly of the present invention thus provides a compact reflective element assembly, which may be readily manufactured, because the reflective element assembly does not include an attachment plate or the like. The mirror reflective element assembly of the present invention thus may provide a low cost, lightweight and compact reflective element assembly that provides for enhanced manufacturing and assembly processes.

These and other objects, advantages, purposes and features of the present invention will become apparent upon review of the following specification in conjunction with the drawings.

BRIEF DESCRIPTION OF THE DRAWINGS

FIG. 2 is a front elevation of a rear reflective element substrate of a reflective element assembly of the mirror assembly of FIG. 1, viewing through the reflective element substrate to show a conductive trace applied to the rear surface of the substrate;

FIG. 3 is a rear elevation of the rear reflective element substrate of FIG. 2;

DESCRIPTION OF THE PREFERRED EMBODIMENTS

Figure 1:
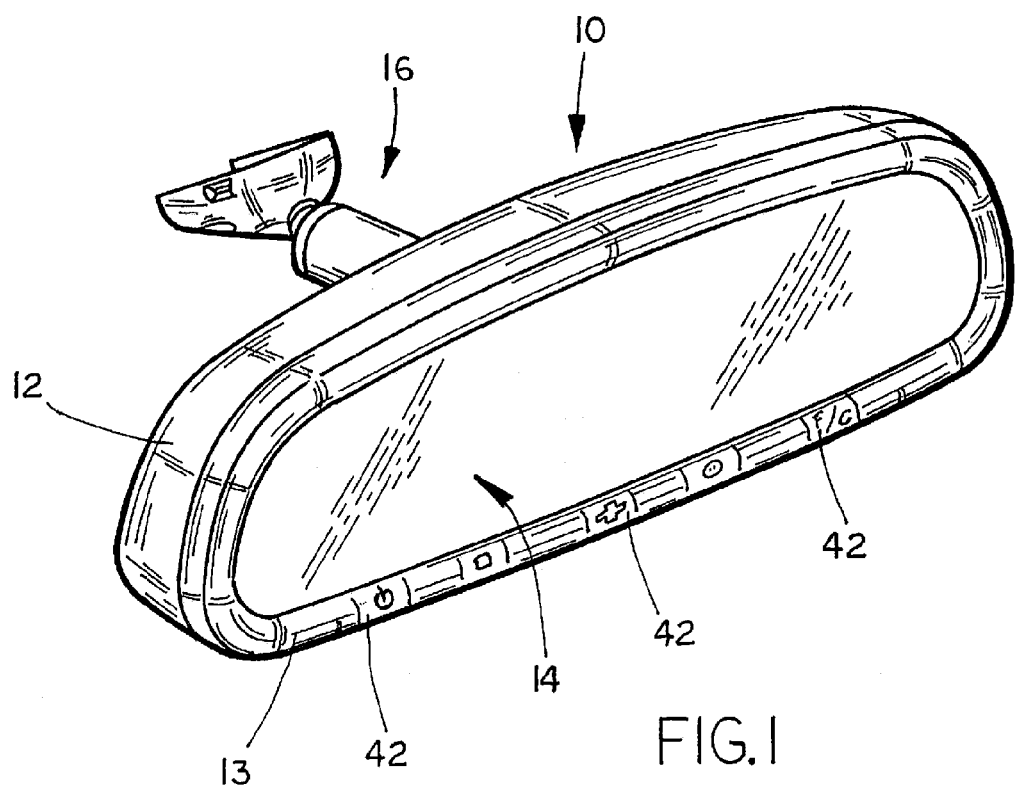
FIG. 1 is a perspective view of an interior rearview mirror assembly in accordance with the present invention.

Referring now to the drawings and the illustrative embodiments depicted therein, an interior rearview mirror assembly 10 includes a casing 12, a bezel 13, a reflective element assembly or cell 14 and a mounting arrangement 16 (FIG. 1) for adjustably mounting the casing and reflective element 14 to an interior portion of a vehicle, such as to a mounting button or the like at an interior surface of a windshield of a vehicle. Mirror reflective element assembly 14 includes a conductive trace or layer or coating 18 (FIG. 2) applied to or disposed on or at the rearward surface (tie surface facing forward or in the direction of travel of the vehicle when the mirror assembly is installed in the vehicle) of a reflective element substrate, such as the typically glass substrate of the reflective element assembly, such as on the rear surface 20*a* (FIGS. 3-6) of a second or rear substrate or glass element 20 of an electro-optic or electrochromic mirror cell (commonly referred to as the fourth surface of the electrochromic mirror cell). The reflective element substrate 20 thus may provide a substantially rigid surface for receiving the conductive trace and circuitry, and the reflective element assembly thus may comprise a circuitry on glass arrangement, whereby no separate rigid printed board or substrate or attachment plate is necessary to support the conductive trace and circuitry at the rear of the reflective element substrate of the reflective element assembly. However, the reflective element assembly and/or the mirror assembly may include other electronic elements or circuitry that may not be positioned or disposed on the glass surface, and/or that may complement the circuitry on the glass substrate, without affecting the scope of the present invention.

In the illustrated embodiment, the reflective element assembly 14 comprises an electro-optic or electrochromic reflective element assembly or cell that includes a front reflective element substrate 22 and the rear reflective element substrate 20. The rear reflective element substrate 20 is spaced from front reflective element substrate 22 with an electrochromic medium 21 and conductive or semi-conductive layers disposed or sandwiched therebetween, as is known in the electrochromic mirror art. The conductive trace 18 may be applied directly onto the rear surface 20*a* (or onto an insulating epoxy or other type of layer or coating applied to the rear surface, as discussed below) of the reflective element substrate 20, and masking portions or layers of a non-conductive material 24 and circuitry components and/or accessories and the like may be applied directly to the conductive trace 18, such that no separate printed board and attachment plate and related components are required.

Although shown and described as an electrochromic reflective element assembly or cell, aspects of the present invention may be equally suitable for and applicable to a prismatic reflective element substrate and assembly or other types of reflective elements and assemblies, without affecting the scope of the present invention. Also, although shown and described as an interior reflective element assembly, aspects of the present invention may be equally suitable for and applicable to exterior mirror assemblies, such as exterior electrochromic rearview mirror assemblies and exterior rearview mirror assemblies with a single reflective element and the like, without affecting the scope of the present invention.

The conductive trace or layer 18 may comprise a conductive epoxy, such as a conductive silver epoxy or the like, that may be screen printed in a desired pattern or trace directly onto the rear surface 20*a* of rear reflective element substrate 20 of reflective element assembly 14 (or onto an insulating layer or the like at the rear surface of the reflective element substrate). In FIG. 2, rear reflective element substrate 20 of reflective element assembly 14 is shown from the front side or surface 20*b*, so that the conductive trace 18 is shown at the rear surface 20*a* of reflective element substrate 20 by viewing through the transparent reflective element substrate 20.

If the mirror reflective element assembly or electrochromic cell 14 comprises a third surface reflective element assembly (where the front surface of the rear substrate, commonly referred to as the third surface of the reflective element assembly or cell, has a reflective and conductive metallic coating or layer or layers 39*a* (FIG. 6), such as a silver or aluminum or chromium or rhodium or other metallic materials or alloys thereof, and one or more non-metallic semi-conductive layers, such as one or more layers of indium tin oxide (ITO), indium tungsten oxide (IWO), indium cerium oxide (ICO), indium oxide (IO) or the like, disposed thereon or applied thereto), the conductive layer or epoxy 18 may be applied directly to a clean glass surface at the rear surface of the rear reflective element substrate (or may be applied to an insulating layer or the like applied directly to the clean glass surface).

Alternately, if the mirror reflective element or electrochromic cell 14 comprises a fourth surface reflective element (where the reflective coating or layer 39*b* (FIG. 6), such as a metallic layer or the like, is applied to the rear or fourth surface of the rear reflective element substrate of the cell), the protective paint layer or layers that are typically applied to the rear surface of the rear reflective element substrate may be replaced or covered with an insulating epoxy layer to provide an insulated surface at the rear of the rear reflective element substrate. The conductive trace 18 may then be applied to the insulating epoxy layer at the fourth surface of the reflective element assembly or cell.

The conductive epoxy layer may be applied as a conductive trace in the desired pattern onto the appropriate rear surface of the reflective element substrate. For example, the conductive epoxy may be screen printed onto the rear surface of the reflective element substrate in the desired pattern, such as shown in FIG. 2. Optionally, the conductive epoxy layer or coating may be applied over a substantial amount of the rear surface of the rear reflective element substrate and may function as an anti-shatter or anti-scatter element to limit or substantially preclude shattering/scattering of the glass reflective element substrate, such as in situations where the vehicle is involved in an accident or the like.

Optionally, the conductive trace and the mask or non-conductive layers and exposed pads or portions may be formed on the rear surface in a similar manner as it is typically formed on a conventional printed circuit board. For Example, a copper layer may be applied to the rear surface of the glass reflective element substrate and the masking or non-conductive layer may be screen printed onto the copper layer and etched away to form the desired pattern, without affecting the scope of the present invention.

After the conductive epoxy or trace has been screen printed or otherwise applied to the rear surface of the reflective element reflective element, the trace may be masked over with a non-conductive or masking layer 24 (FIGS. 3-5) that covers the conductive trace except at portions or pads 18*a* (FIG. 3) of conductive trace 18 for affixing circuitry and components thereto, as discussed below. The non-conductive layer 24 may substantially cover the conductive trace except in areas where components or wires or accessories or the like may be positioned to provide the desired function to the reflective element assembly or cell 14. The components or wires or accessories (shown generally at 26 in FIGS. 4 and 6) may be affixed to the appropriate portions or pads 18a that are exposed through the masking layer 24 to complete the circuitry that is integral with the mirror reflective element assembly or cell.

Also, after the conductive trace or epoxy layer has been screen printed or otherwise applied to the rear surface of the reflective element substrate, the conductive layer may be cured. It is envisioned that the conductive layer may be cured onto the rear surface of the reflective element substrate at the same time that the electrochromic reflective element assembly or cell is cured (such as at the same time that the epoxy seal 21a (FIG. 6) that is disposed around the electrochromic medium and between the substrates is cured) to cure both the conductive epoxy layer and the epoxy seal of the electrochromic cell with the same curing process. The epoxy seal and the epoxy trace or layer may be cured via an air curing process or an oven curing process or the like, without affecting the scope of the present invention.

Optionally, the non-conductive layer and electronic components or circuitry may be applied to the conductive layer and pads or portions of the conductive layer before the conductive layer has been cured. The components may thus be temporarily affixed to the conductive pads, such as via adhesive dots or drops or the like applied (and optionally robotically applied) to the pads and/or the components, and then the reflective element assembly and epoxy seal and/or circuitry may be cured to secure the circuitry and components to the conductive trace applied to the rear surface of the mirror reflective element assembly. Such an approach provides for attachment of the components and curing of the conductive layer, and optionally of the epoxy seal of the reflective element assembly as well, in a single step, thereby substantially enhancing the manufacturing processes for manufacturing the electrochromic mirror reflective element assembly or cell.

The circuitry and components, such as resistors, capacitors, jumpers, and clips and the like, and accessories, such as sensors, display elements, such as light emitting diodes (LEDs), liquid crystal display elements (LCDs), vacuum fluorescent (VF) display elements, electroluminescent (EL) display elements or video display elements or other types of display elements or displays, sensors or antennae and the like, may be applied to and secured to the appropriate exposed pads or portions of the conductive trace, such as after the trace has been masked or covered by the non-conductive layer or material. Some of the electronic components or circuitry may also be screened or applied to the conductive trace. For example, it is envisioned that carbon ink resistors may be printed onto the conductive trace with another printing pass or screening pass. The carbon ink resistors may be applied utilizing lasers to tighten the tolerances to a desired level. This approach may reduce the need for separate resistors that would otherwise have to be applied during a later step. However, other known or conventional type resistors may be attached to the appropriate pads or portions, without affecting the scope of the present invention. In situations where circuitry paths need to cross over one another (in such situations, the other side of a printed circuit board is used to make such a cross over in a conventional printed circuit board), a zero ohm jumper or resistor may be attached to spaced apart pads or portions of the conductive trace to bridge or span the gap between the pads or portions and effectively cross over a portion of a conductive trace positioned between the spaced apart pads or portions.

Although described above as being applied directly to the rear surface of the reflective element substrate and being cured thereon, it is envisioned that the conductive trace may be applied to a substantially non-stick surface and cured thereon and then peeled from the surface and applied to the rear surface of the reflective element substrate as a pre-cured flexible conductive trace. This may be preferred in some applications to minimize the waste of conductive traces in situations where some of the reflective element assemblies may be discarded or scrapped due to defects in the reflective element assemblies. The conductive trace may then be applied to a reflective element substrate of a reflective element assembly or cell after the epoxy seal has been cured and after the reflective element assembly or cell has met the quality requirements. The conductive trace may be a flexible element that may be readily applied to or adhered to the reflective element substrate surface.

It is further envisioned that the conductive trace may be initially applied to the separate surface, and the non-conductive layer or masking and the circuitry and electronic components and accessories may be applied to the conductive trace, such as in the manner as described above. The pre-cured flexible circuit sheet may then be peeled from the surface and applied to or rolled onto the rear surface of the reflective element substrate. The busbars and other accessories or components may be connected to the appropriate exposed pads or portions of the conductive trace on the flexible circuit sheet either while the flexible circuit sheet is at the separate surface or at another surface, or after the sheet has been applied to the rear surface of the reflective element substrate. The flexible circuit sheet may be adhered to or bonded to or otherwise secured to the rear surface of the reflective element substrate via any suitable means, without affecting the scope of the present invention.

As discussed above, the rearview mirror reflective element assembly of the present invention may comprise an electro-optic or electrochromic reflective element assembly or cell, such as an electrochromic mirror reflective element assembly utilizing principles disclosed in commonly assigned U.S. Pat. Nos. 6,690,268; 5,140,455; 5,151,816; 6,178,034; 6,154,306; 6,002,544; 5,567,360; 5,525,264; 5,610,756; 5,406,414; 5,253,109; 5,076,673; 5,073,012; 5,117,346; 5,724,187; 5,668,663; 5,910,854; 5,142,407; and/or 4,712,879, which are hereby incorporated herein by reference, and/or as disclosed in the following publications: N. R. Lynam, "Electrochromic Automotive Day/Night Mirrors", SAE Technical Paper Series 870636 (1987); N. R. Lynam, "Smart Windows for Automobiles", SAE Technical Paper Series 900419 (1990); N. R. Lynam and A. Agrawal, "Automotive Applications of Chromogenic Materials", Large Area Chromogenics Materials and Devices for Transmittance Control, C. M. Lampert and C. G. Granquist, EDS., Optical Engineering Press, Wash. (1990), which are hereby incorporated by reference herein.

Figure 4:
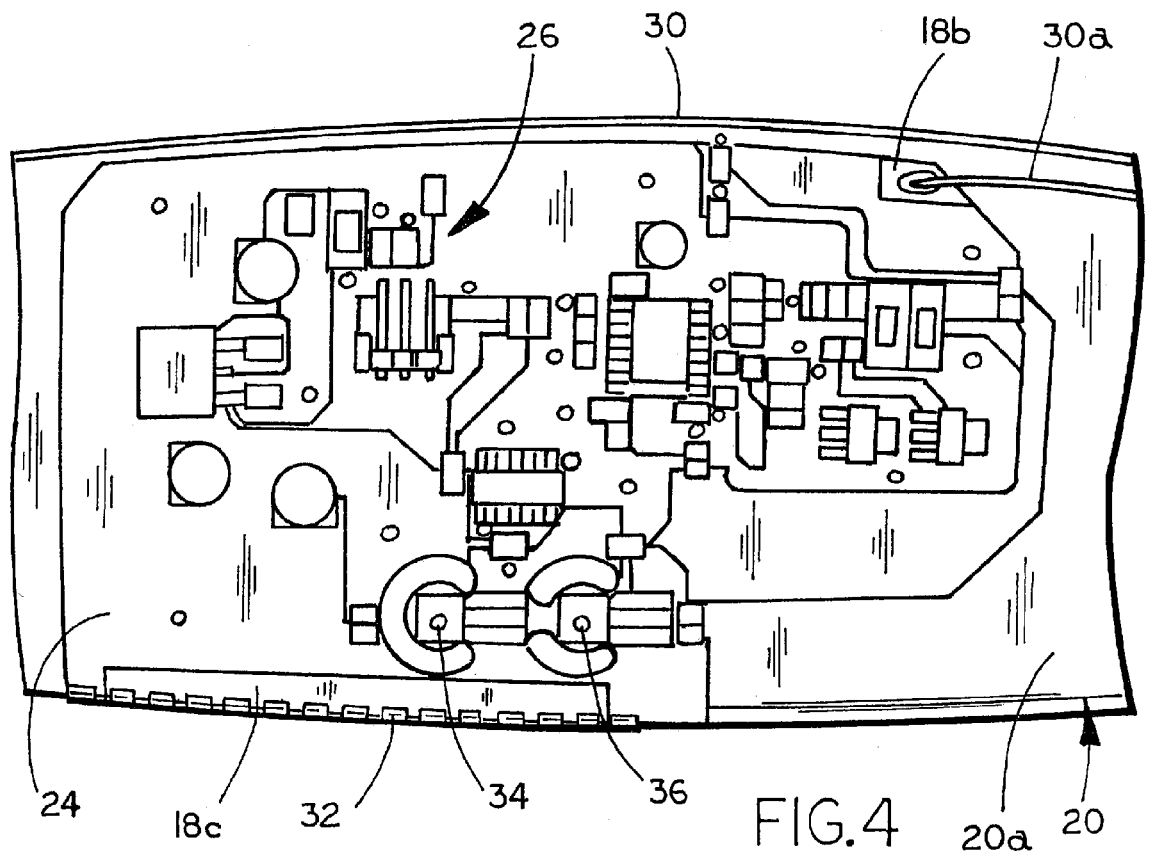
FIG. 4 is an enlarged rear elevation of the rear reflective element substrate of FIGS. 2 and 3, with components and/or circuitry attached to the conductive trace.
Figure 5:
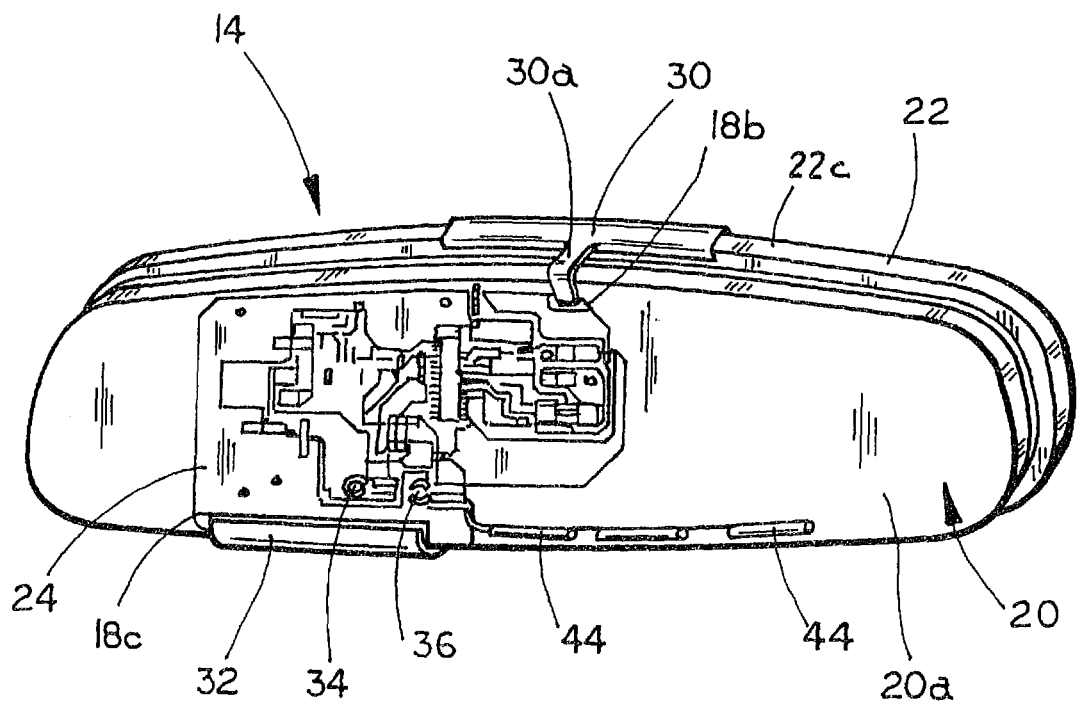
FIG. 5 is a rear perspective view of an electrochromic mirror reflective element assembly having the rear reflective element substrate of FIGS. 2-4.

As shown in FIGS. 4 and 5, mirror reflective element assembly or cell 14 may include front reflective element substrate 22 and rear reflective element substrate 20 with electrochromic medium 21 sandwiched therebetween. The front reflective element substrate 22 has a front surface 22a (the first surface of the electrochromic cell) and a rear surface 22b (the second surface of the electrochromic cell), which may include one or more transparent semi-conductive layers (such as an ITO layer or the like, or such as disclosed in PCT Application No. PCT/US03/29776, filed Sep. 19, 2003 by Donnelly Corporation et al. for ELECTROCHROMIC MIRROR ASSEMBLY, which is hereby incorporated herein by reference) thereon. The rear reflective element substrate 20 may include one or more transparent semi-conductive layers (such as an ITO layer or the like), and/or a metallic conductive layer (such as a layer of silver, aluminum, chromium or the like or an alloy thereof), on its front surface 20b (the third surface of the electrochromic cell), and may include multiple layers such as disclosed in PCT Application No. PCT/US03/29776, filed Sep. 19, 2003 by Donnelly Corporation et al. for MIRROR REFLECTIVE ELEMENT ASSEMBLY, which is hereby incorporated herein by reference. The reflective element assembly 14 thus may comprise a third surface transflective element assembly or cell, whereby the reflective layer or surface is disposed at the third surface of the cell or at the front surface of the rear reflective element substrate for viewing by a driver of the vehicle.

Electrochromic reflective element assembly or cell 14 may include a front busbar or clip 30 that may engage or clip onto an edge portion (such as an upper edge portion 22c) of front reflective element substrate 22 to provide electrical power or current to the semiconductive layer or layers on the rear surface 22b of front reflective element substrate 22. The cell 14 may also include a rear busbar or clip 32 that may engage or clip onto an edge portion (such as a lower edge portion 20c) of rear substrate 20 to provide electrical power or current to the semiconductive or conductive layer or layers on the front surface 20b of rear substrate 20. The front clip 30 may include an extension 30a that extends rearward over the rear substrate 20 and that engages a busbar pad 18b at an upper portion of the conductive trace 18, while the rear clip 32 may engage a busbar pad 18c at a lower portion of the conductive trace 18, such that electrical power or current may be applied to front clip 30 and to rear clip 32 to darken or color the electrochromic medium 21 as desired.

The extension 30a of front clip or busbar 30 may be a separate extension attached to the clip or busbar, or may be integral with the clip or busbar, without affecting the scope of the present invention. The conductive trace 18 and exposed portions or pads 18b, 18c may extend to the upper and lower edges of the reflective element substrate and may act as a conductive rail along the edges so the clips 30, 32 may contact the conductive-trace directly, with no wiring being necessary to connect the clips or busbars to the circuitry. The present invention thus may avoid the need to solder leads onto the busbars as is typically required with conventional busbars, such that the electrochromic mirror reflective element assembly of the present invention may provide for enhanced manufacturing processing. Optionally, an ASIC (application specific integrated circuit) die with external capacitors and clips may be applied at or near the upper and lower edges of the rear reflective element substrate for connection to the electrochromic clips or busbars 30, 32. Optionally, and as shown in FIG. 4, the extension 30a may comprise a wire or lead that is soldered or otherwise conductively connected or secured to the busbar pad 18b to connect an end or portion of the clip or busbar 30 to the busbar pad 18b, without affecting the scope of the present invention. The clips or busbars and substrates and coatings may be configured and may function similar to known busbars and substrates and coatings, or may be of the types described in PCT Application No. PCT/US03/35381, filed Nov. 5, 2003 by Donnelly Corporation et al. for ELECTRO-OPTIC REFLECTIVE ELEMENT ASSEMBLY, which is hereby incorporated herein by reference.

Figure 6:
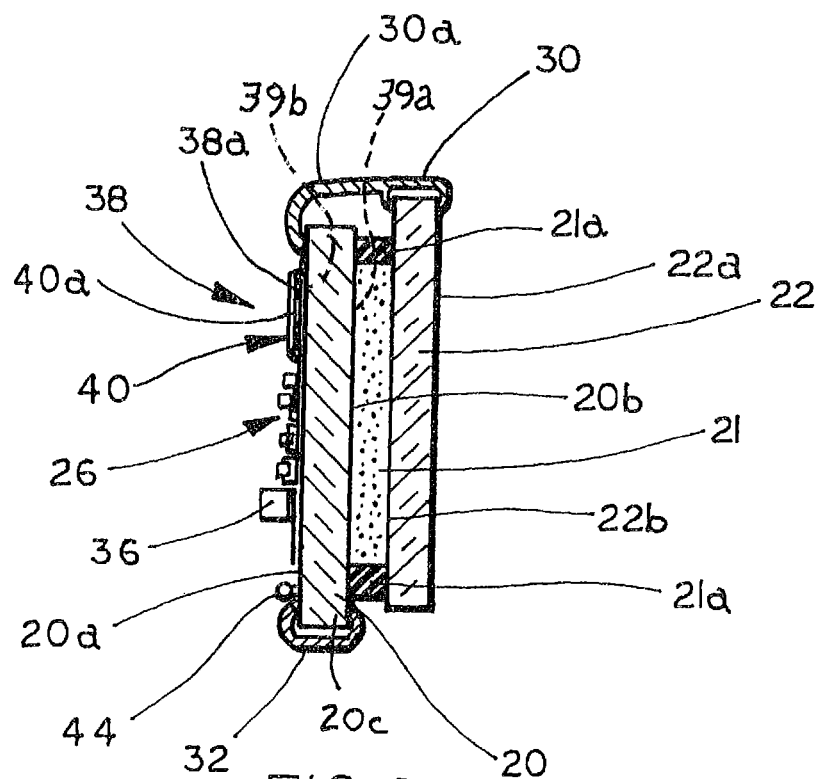
FIG. 6 is a sectional view of the electrochromic mirror reflective element assembly of FIG. 5.

The conductive trace 18 and electronic components and/or circuitry 26 may comprise or mount or attach one or more accessories, such as lights, a microphone, user actuatable controls or inputs, sensors, such as photo sensors or the like, or any other type of accessory suitable for such an application, as discussed below. For example, and as shown in FIGS. 4-6, one or more light sensors or photo diodes 34, 36 may be attached or mounted to appropriate exposed pads or portions 18d (FIG. 3) of conductive trace 18, and may be operable to sense light at the mirror assembly. More particularly, light sensor 34 may be a forwardly facing (with respect to the direction of travel of the vehicle) sensor operable to detect the ambient light at the mirror assembly (such as via detecting light through an opening in the mirror casing or the like that receives light from forward of the mirror assembly and in the direction of travel of the vehicle), while light sensor 36 may be operable to detect glare at the mirror reflective element (such as by detecting light from rearward of the mirror assembly and from rearward of the vehicle). In order for light sensor 36 to detect the glare light rearward of the mirror assembly, it is envisioned that a window or transparent portion or area may be formed in the reflective layer or coating of the reflective element substrates to allow the sensor to view or receive light from rearwardly of the mirror assembly. Alternately, the light sensor may receive light that passes through the electro-optic reflective element assembly or cell, such as in display on demand or transflective cells and the like, without affecting the scope of the present invention.

Figure 7:
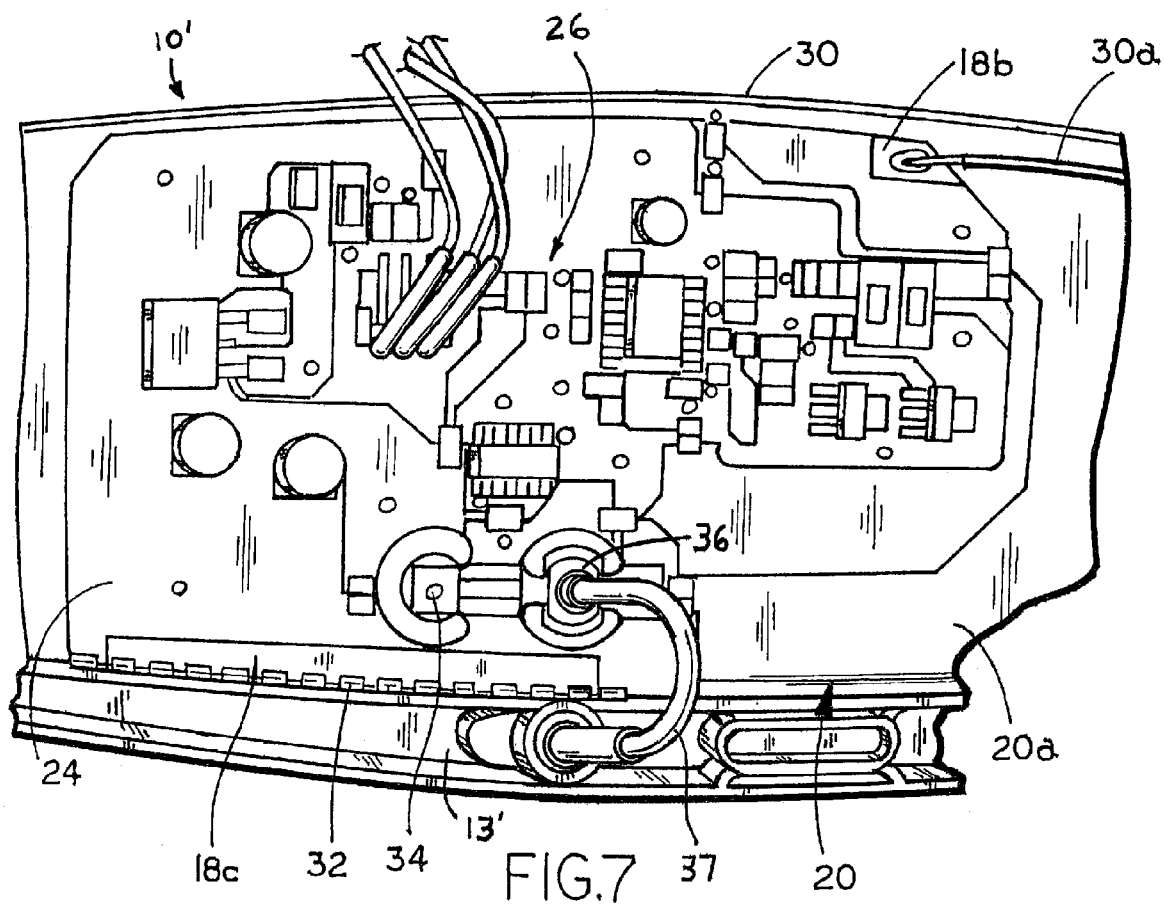
FIG. 7 is a rear perspective view of a portion of a reflective element assembly of the present invention, with a light pipe attached between circuitry on the reflective element substrate and a bezel portion of the mirror assembly.

Optionally, and with reference to FIG. 7, a light pipe 37 may be implemented to direct light through the bezel or casing of the mirror assembly and to bend the light, such as approximately 90 degrees or approximately 180 degrees (depending on the mounting orientation of the sensor) to direct or deliver the light to the sensor 36 at the circuitry on the back of the rear or second reflective element substrate, without affecting the scope of the present invention. In the illustrated embodiment of FIG. 7, the light pipe 37 functions to bend the light about 180 degrees to direct light from rearward of the mirror assembly (such as light at the bezel portion 13' of the mirror assembly 10') to the forward facing light sensor or photo sensor 36 at the conductive trace and circuitry 26 at the rear or fourth surface of the reflective element assembly. Optionally, the light pipe may extend between the circuitry and the back of an electrochromic reflective element assembly or cell where the light will be sensed/gathered/received from light passing through the cell, without affecting the scope of the present invention. Such an application may be suitable for use in applications with a transflective or display on demand type of cell. The sensors thus may face in generally the same direction on the circuitry, but may utilize light gathering means, such as one or more light pipes or the like, to gather and/or receive light from different directions, and may utilize aspects of the sensors described in U.S. patent application Ser. No. 10/229,573, filed Aug. 28, 2002 by Blank et al. for VEHICLE MIRROR SYSTEM WITH LIGHT CONDUCTING MEMBER, published Mar. 6, 2003 as U.S. Publication No. 2003-0043589, now U.S. Pat. No. 7,008,090, which is hereby incorporated herein by reference.

Although shown and described as comprising an electrochromic reflective element assembly, the present invention is equally applicable to prismatic reflective element assemblies and the like. For example, a conductive trace may be applied to a rear surface of a prismatic or wedge-shaped reflective element substrate, and electronic components and/or circuitry may be applied to the conductive trace, such as in a similar manner as described above, without affecting the scope of the present invention. The prismatic mirror assembly may comprise any type of prismatic mirror assembly, such as prismatic mirror assembly utilizing aspects described in U.S. Pat. Nos. 6,318,870; 5,327,288; 4,948,242; 4,826,289; 4,436,371; and 4,435,042; and PCT Application No. PCT/US04/015424, filed May 18, 2004 by Donnelly Corporation et al. for MIRROR ASSEMBLY FOR VEHICLE; and U.S. patent application Ser. No. 10/933,842, filed Sep. 3, 2004, now U.S. Pat. No. 7,249,860, which are hereby incorporated herein by reference. Optionally, the prismatic reflective element may comprise a conventional prismatic reflective element or prism or may comprise a prismatic reflective element of the types described in PCT Application No. PCT/US03/29776, filed Sep. 19, 2003 by Donnelly Corp. et al. for MIRROR REFLECTIVE ELEMENT ASSEMBLY; U.S. patent application Ser. No. 10/709,434, filed May 5, 2004 by Lynam for MIRROR REFLECTIVE ELEMENT, now U.S. Pat. No. 7,420,756; and U.S. provisional application Ser. No. 60/525,952, filed Nov. 26, 2003 by Lynam for MIRROR REFLECTIVE ELEMENT FOR A VEHICLE, which are all hereby incorporated herein by reference, without affecting the scope of the present invention. A variety of mirror accessories and constructions are known in the art, such as those disclosed in U.S. Pat. Nos. 5,555,136; 5,582,383; 5,680,263; 6,227,675; 6,229,319; and 6,315,421 (the entire disclosures of which are hereby incorporated by reference herein), that can utilize aspects of the present invention.

Optionally, the mirror reflective element assembly or cell 14 and electronic components and/or circuitry applied to the rear surface of the rear reflective element substrate may include display elements, such as for a display on demand type of display, such as of the types disclosed in commonly assigned U.S. Pat. Nos. 6,690,268; 5,668,663 and 5,724,187, and/or in U.S. patent application Ser. No. 10/054,633, filed Jan. 22, 2002 by Lynam et al. for VEHICULAR LIGHTING SYSTEM, now U.S. Pat. No. 7,195,381, and/or in PCT Application No. PCT/US03/29776, filed Sep. 9, 2003 by Donnelly Corp. et al. for MIRROR REFLECTIVE ELEMENT ASSEMBLY; and/or PCT Application No. PCT/US03/40611, filed Dec. 19, 2003 by Donnelly Corp. et al. for ACCESSORY SYSTEM FOR VEHICLE, which are all hereby incorporated herein by reference.

With such a display, it is not only desirable to adjust the display brightness according to ambient lighting conditions, but it is also desirable to adjust the display brightness such that a sufficient contrast ratio is maintained against the variable background brightness of the reflected scene. Also, it may be desirable to compensate for changes in transmission of the electrochromic device to control rearward glare sources, so that the display brightness appears to be maintained at a generally constant level. The display and/or transmissivity of the electro-optic device may be adjusted to provide the desired function or viewability, such as by utilizing aspects of the systems described in U.S. patent application Ser. No. 10/427,026, filed Apr. 30, 2003 by Drummond et al. for VEHICLE REARVIEW MIRROR SYSTEM, now U.S. Pat. No. 6,918,674, which is hereby incorporated herein by reference. Optionally, the circuitry 26 may include a light emitting diode (LED) array module or the like bonded or placed on or at or connected to the appropriate portions or pads of the conductive trace applied to the rear surface of the rear reflective element substrate and operable to emit light or display information through the mirror cell for viewing through the reflective element substrate or substrates by the driver or occupant of the vehicle. Other types of display elements may be implemented without affecting the scope of the present invention.

Optionally, and as shown in FIG. 6, the electrochromic mirror cell 14 may incorporate an integrated display element, such as a liquid crystal display (LCD) element 38, on or at the rear surface 20*a* of rear reflective element substrate 20. Typically, a liquid crystal display element may include two sheets of spaced apart glass sheets with an appropriate conductive pattern printed on one of the surfaces of one of the sheets. The present invention may incorporate such a display on the rear surface of the rear reflective element substrate by applying a clear conductive pattern 38*a* (such as an ITO or the like) on the rear surface of the rear reflective element substrate, and such as at a window formed in the silvering or reflective layer of the mirror reflective element assembly or cell. The conductive pattern may be connected directly to the conductive trace applied to the rear surface of the reflective element substrate. An outer LCD glass sheet 40 may be provided with a continuous conductive coating (such as an ITO or the like) on its rear surface 40*a* and may be placed at the conductive pattern 38*a* and spaced therefrom, such as via glass spacer beads or the like. The glass sheet 40 may include a jumper lead to connect to an appropriate trace or pad at the rear surface 20*a* of rear substrate 20, or a connecting bump or pad may be formed in the trace to span the gap between the glass sheet 40 and the rear surface of the rear reflective element substrate and to connect the conductive trace to the continuous conductive coating on the glass sheet 40, without affecting the scope of the present invention. The mirror reflective element assembly or cell of the present invention thus may integrate an LCD display onto the reflective element or glass substrate of the reflective element assembly by using the reflective element or glass substrate of the mirror cell as the front glass sheet of the LCD display element.

Optionally, the printed circuit board of the mirror assembly of the present invention may include a display element along or partially along an edge of the board and may include one or more user-actuatable controls or buttons near or adjacent to the display element. The display element may be any type of display element, such as a vacuum fluorescent (VF) display element, a light emitting diode (LED) display element, an electroluminescent (EL) display element, a liquid crystal display (LCD) element, a video screen display element or the like, and may be operable to display various information (as discrete characters, icons or the like, or in a multi-pixel manner) to the driver of the vehicle, such as passenger side inflatable restraint (PSIR) information, tire pressure status, and/or the like. The buttons may be for actuating or controlling various accessories or controls or components associated with the vehicle, such as for a compass calibration setting or zone setting, a telematics actuation, a garage door opener, an electronic toll control (such as disclosed in U.S. Pat. No. 6,690,268, which is hereby incorporated herein by reference), and/or the like, or may be for switching the display between various functions or modes, without affecting the scope of the present invention.

Optionally, and as can be seen with reference to FIG. 1, electrochromic mirror reflective element assembly or cell 14 may include or may be associated with one or more switchable accessories, which may be toggled via actuation of one or more switches or buttons or inputs 42 at the front of the mirror assembly 10, such as along the bezel 13 of the mirror assembly 10. The user inputs or buttons may be for actuating or controlling various accessories or controls or components associated with the vehicle, such as for a compass calibration setting or zone setting, a telematics actuation, a garage door opener, an electronic toll control (such as disclosed in U.S. Pat. No. 6,690,268, which is hereby incorporated herein by reference), and/or the like, or may be for switching the display between various functions or modes, without affecting the scope of the present invention. Optionally, the user inputs may comprise touch sensors or proximity sensing inputs or the like, such as sensors of the types described in U.S. Pat. Nos. 6,001,486; 6,310,611; 6,320,282; 6,627,918; and 5,594,222; and/or U.S. Pat. Publication No. 2002/0044065, published Apr. 18, 2002 by Quist et al. for INTERACTIVE AUTOMOTIVE REARVISION SYSTEM, now U.S. Pat. No. 7,224,324; and/or U.S. patent application Ser. No.

10/933,842, filed Sep. 3, 2004, now U.S. Pat. No. 7,249,860; and/or PCT Application No. PCT/US03/40611, filed Dec. 19, 2003 by Donnelly Corp. et al. for ACCESSORY SYSTEM FOR VEHICLE, which are hereby incorporated herein by reference, or may comprise inputs molded within the bezel of the mirror assembly, such as described in U.S. provisional applications, Ser. No. 60/535,559, filed Jan. 9, 2004 by Lindahl for MIRROR ASSEMBLY; and/or Ser. No. 60/553,517, filed Mar. 16, 2004 by Lindahl et al. for MIRROR ASSEMBLY, which are hereby incorporated herein by reference, or may comprise membrane type switches, such as described in U.S. provisional application Ser. No. 60/575,904, filed Jun. 1, 2004 by Uken for MIRROR ASSEMBLY FOR VEHICLE, which is hereby incorporated herein by reference; and/or the like, without affecting the scope of the present invention.

It is envisioned that the inputs 42 may be formed in the bezel 13 and that the circuitry applied to or disposed at the rear surface of the rear reflective element substrate may include one or more proximity sensors or sensing elements or antennae 44 (FIGS. 5 and 6) positioned along a lower edge of the rear surface of the rear reflective element substrate and generally corresponding with a respective one of the inputs 42. For example, the antenna or antennae or sensing elements may be adhered or clipped or otherwise secured to appropriate exposed pads or portions of the conductive trace 18 to position the antenna or antennae at the desired or appropriate location at the rear of the reflective element substrate. The antenna or antennae or sensing elements 44 may detect the presence of a person's finger at or near the respective input or inputs 42 and may actuate or control a display element or the like or may actuate or control or trigger the circuitry to switch or toggle the device associated with the input 42 in response to such a detection.

As shown in FIG. 5, the sensing elements 44 may be disposed along the lower or bottom edge of the rear reflective element substrate and may monitor a respective zone around the lower edge of the reflective element substrate or glass substrate. The sensing element or elements may provide a three dimensional cylinder of detection that extends along the bottom edge of the reflective element substrate and that encompasses the respective icon or input 42 at the bezel. As also shown in FIG. 5, the sensing element may comprise multiple separate sensing elements or antennae or antenna segments that may monitor separate zones corresponding to the respective inputs 42 at the bezel. The inputs 42 at the bezel thus may comprise a screen printed icon or character or the like at the bezel, and may not comprise any movable buttons or inputs or the like. As the user's finger approaches the desired input 42 (or spot or icon on the bezel), the corresponding antenna segment may detect the presence of the finger prior to contact as the finger enters the zone or cylinder of detection for that antenna segment. The electronic components and/or circuitry associated with that particular antenna may then toggle the device or accessory associated with the input, such as between an on/off status, a temperature or compass selection (such as for a temperature/compass display), a degrees F./degrees C. selection (such as for a temperature display), and/or the like.

Optionally, the controls may be operable to activate/deactivate/toggle/control an accessory in response to a detection of a user's finger or the like approaching the input or button region or sensing element at the mirror assembly. Because such inputs may be individual or separate proximity sensors or antennae positioned within the mirror assembly and not readily viewable or discernable by the driver or occupant of the vehicle, the mirror assembly may include a display or indicator that indicates the function of each input. Preferably, the mirror assembly may include a control or circuitry that selectively or occasionally activates a display to temporarily display the feature or function or accessory associated with the particular input or input region of the mirror assembly, such as in response to the user's finger or the like approaching the input area or the like. For example, it is further envisioned that when a user's finger is first detected as it approaches the input region (such as when the user's finger or the like is within a first threshold distance from one of the sensors, such as within about ¼ or ½ of an inch or thereabouts), the control or circuitry may activate a display (such as a display on demand type of display or transflective display that is viewable through the reflective element of the mirror assembly, such as described in U.S. Pat. Nos. 6,690,268; 5,668,663 and/or 5,724,187, and/or in U.S. patent application Ser. No. 10/054,633, filed Jan. 22, 2002 by Lynam et al. for VEHICULAR LIGHTING SYSTEM, now U.S. Pat. No. 7,195,381, and/or Ser. No. 10/933,842, filed Sep. 3, 2004, now U.S. Pat. No. 7,249,860; and/or PCT Application No. PCT/US03/29776, filed Sep. 9, 2003 by Donnelly Corp. et al. for MIRROR REFLECTIVE ELEMENT ASSEMBLY; and/or PCT Application No. PCT/US03/40611, filed Dec. 19, 2003 by Donnelly Corp. et al. for ACCESSORY SYSTEM FOR VEHICLE, which are all hereby incorporated herein by reference) that indicates the accessory or feature or function associated with at least some or all of the inputs along the bezel or other region of the mirror assembly. The display may list or indicate the features (such as via text or icons or other indicia) at areas of the reflective element that are near to or generally adjacent to the respective inputs or input regions.

When the user then moves his or her finger to touch or contact the desired or appropriate input (or may move the finger closer to the input region or sensor, such as within a second threshold distance from the sensor that is smaller than the first threshold distance), such as at the bezel or the like, the detection of the contact (or of a closer proximity of the finger) may cause the control to activate/deactivate or toggle/adjust or control the accessory or feature or function associated with that input or input region. As the user's finger is moved closer to or contacts the selected input region, the displays for the other inputs may deactivate so that only the display for the selected input remains viewable by the user. Optionally, the detection of the closer proximity (such as within the second threshold distance or touching) may cause other menus or the like to appear at the mirror assembly, whereby the user may toggle or scroll through the menus to accomplish the desired task or activate/deactivate/adjust the desired or appropriate accessory or function or feature. The user thus may activate/deactivate/toggle/adjust/control the accessory or function or feature associated with the selected input or may scroll through a menu shown in the display at the reflective element.

Optionally, it is envisioned that the control or circuitry may initially activate a display element or display device associated with one of the inputs or buttons or sensor regions, such that as the user's finger approaches a particular input or button or sensor region (such as when the user's finger is within a threshold distance of the input, such as within approximately ¼ or ½ inches or thereabouts of the input or input region), the control or circuitry may activate the respective display that indicates the accessory or feature or function associated with that particular input or input region or sensor. The user thus may move their finger along the front of the mirror assembly (and over and along the separate/distinct sensors or input regions) and view the display or information for the accessory or feature or function associated with each region or input. When the user's finger is located at the desired function, the user may then contact the input region (or may move the finger closer to the input region or sensor), whereby the detection of the contact (or of a closer proximity of the finger) may cause the control to activate/deactivate or toggle/adjust or control the accessory or feature or function associated with that input or input region, or may cause other menus or the like to appear at the mirror assembly, such as described above.

The present invention thus provides for the circuitry and electronic components to be kept substantially or entirely at the rear of the mirror reflective element assembly or cell, yet provides for front switching of an accessory or the like. The present invention provides for such front switching in response to a touch or approach of a designated area at the bezel (or elsewhere around the mirror assembly), without any buttons and associated wires or leads being needed at the bezel area. Also, because the proximity sensors or antennae or antenna segments are positioned at the rear of the reflective element or cell, no soldering or otherwise connecting of leads or wires to the buttons at the front of the mirror assembly is required. The present invention thus provides for such functions with a bezel that provides a reduced cost and complexity of the bezel and the casing of the mirror assembly.

The electronic components or circuitry and/or accessories may receive power from the vehicle power source, whereby the vehicle may include wiring to the mirror assembly, such as two wires for power and ground to the mirror assembly. Optionally, the vehicle may incorporate a telematics system, such as an ONSTAR® system or the like, which may have circuitry in the instrument panel of the vehicle. The telematics circuitry may include wires connected to the buttons or inputs at the mirror assembly that provide a toggling function to the telematics system in response to actuation of the respective telematics inputs. It is envisioned that the same wiring to the mirror assembly may also be selectably usable to provide for signal transmission from the telematics system to the mirror assembly, such as for a global positioning system (GPS) function or the like.

Optionally, the power and ground connection may only be provided to the mounting bracket, which may provide an electrical contact to the mirror circuitry via an electrical contact or wiper action at the ball and socket connection of the mounting arm or mounting arrangement of the mirror assembly. For example, the signals may be provided via a mounting arrangement utilizing aspects of the mounting arrangements described in U.S. patent application Ser. No. 10/032,401, filed Dec. 20, 2001, now U.S. Pat. Publication No. US2002/0088916A1, published Jul. 11, 2002, now U.S. Pat. No. 6,877,709; and/or PCT Application No. PCT/US2004/015424, filed May 18, 2004 by Donnelly Corp. et al. for MIRROR ASSEMBLY FOR VEHICLE, and/or U.S. provisional application Ser. No. 60/609,642, filed Sep. 14, 2004 by Karner for MOUNTING ASSEMBLY FOR MIRROR AND METHOD OF MAKING SAME, which are hereby incorporated herein by reference, or may utilize electrical connection principles of the type described in International Publication No. WO 2003/095269 A3, published Nov. 20, 2003 for REARVIEW MIRROR ASSEMBLIES, which is hereby incorporated herein by reference. The signals to control the accessories or circuitry of the mirror assembly may optionally be provided through an infrared link between the mounting bracket and the circuitry in the mirror, such as described in U.S. patent application Ser. No. 10/456,599, filed Jun. 6, 2003 by Weller et al. for INTERIOR REARVIEW MIRROR SYSTEM WITH COMPASS, now U.S. Pat. No. 7,004,593, which is hereby incorporated herein by reference.

Optionally, the conductive trace and electronic components or circuitry at the reflective element substrate of the mirror assembly may provide or include or be associated with other accessories, such as a rain sensor (such as the type disclosed in commonly assigned U.S. Pat. Nos. 6,320,176; 6,353,392 and 6,313,454, which are hereby incorporated herein by reference), an image sensor (such as a video camera, such as a CMOS imaging array sensor, a CCD sensor or the like, such as the types disclosed in commonly assigned, U.S. Pat. Nos. 5,550,677; 6,097,023 and 5,796,094, which are hereby incorporated herein by reference), a temperature sensor (such as a contact temperature sensor for measuring the temperature at or of the windshield), an antenna, a compass (such as the types disclosed in U.S. patent application Ser. No. 10/456,599, filed Jun. 6, 2003 by Weller et al. for INTERIOR REARVIEW MIRROR SYSTEM WITH COMPASS, now U.S. Pat. No. 7,004,593, which is hereby incorporated herein by reference) or any other sensor or accessory or device. For example, the mirror assembly may include a forward facing video image sensor or system, which may include an intelligent rain sensor (such as the type disclosed in commonly assigned U.S. Pat. Nos. 6,320,176; 6,353,392 and 6,313,454, which are hereby incorporated herein by reference), an image or vision system (including an imaging sensor, such as a video camera, such as a CMOS imaging array sensor, a CCD sensor or the like, such as the types disclosed in commonly assigned, U.S. Pat. Nos. 5,550,677; 6,097,023 and 5,796,094, and U.S. patent application Ser. No. 10/422,378, filed Apr. 24, 2003 by Schofield for IMAGING SYSTEM FOR VEHICLE, now U.S. Pat. No. 6,946,978, which are hereby incorporated herein by reference), an intelligent headlamp controller (such as the type disclosed in U.S. Pat. No. 5,796,094 and/or in U.S. patent application Ser. No. 10/355,454, filed Jan. 31, 2003 by Schofield et al. for VEHICLE ACCESSORY MODULE, now U.S. Pat. No. 6,824,281, which are hereby incorporated herein by reference), an intelligent lane departure warning system, such as the type disclosed in U.S. patent application Ser. No. 10/427,051, filed Apr. 30, 2003 by Pawlicki et al. for OBJECT DETECTION SYSTEM FOR VEHICLE, now U.S. Pat. No. 7,038,577, which is hereby incorporated herein by reference, and/or the like. Optionally, the mirror assembly of the present invention may include one or more displays, such as a text display, an iconistic display, a display on demand type display (such as may be implemented with a transflective reflective element, such as described in U.S. Pat. Nos. 6,690,268; 5,668,663 and 5,724,187, which are hereby incorporated by reference herein), a video or touch screen interface display, or the like, and/or one or more sensors or other accessories, such as a biometric imager, such as for fingerprint authentication or the like, an infrared sensor, such as a zonal temperature sensor, such as suitable for an auto climate control, a forward facing image sensor, such as described above, a rearward facing image sensor (such as for biometric imaging (such as for face recognition, iris recognition or the like), seat height or position detection, drowsiness detection, safety/restraints, object detection and position, emergency response image capture system, intrusion detection or the like), and/or an electronic field sensor (such as the type disclosed in commonly assigned U.S. Pat. No. 6,768,420, which is hereby incorporated herein by reference) and/or the like. The display and/or accessories may be associated with a communication system, a speaker, a telematics module (which may include a GPS module, a wireless communication module, an human/machine interface (HMI), a display, such as an LED display, a dot matrix display, an alpha numeric display, a video display or the like, and/or a microphone, which may be operable for speech or voice recognition, noise reduction or noise cancellation), a humidity sensor, a remote keyless entry sensor, a tire pressure monitoring system (TPMS) (such as the types described in U.S. Pat. Nos. 6,731,205; 6,294,989; 6,124,647; 6,445,287; and/or 6,472,979, and/or U.S. provisional application Ser. No. 60/611,796, filed Sep. 21, 2004 by O'Brien for TIRE PRESSURE ALERT SYSTEM, which are hereby incorporated herein by reference), an electronic toll collection sensor, an intelligent headlamp control, user interface controls (such as buttons, switches or the like for controlling various accessories of the vehicle, such as a sunroof, a communication system, lamps, security systems, displays or the like) or any other accessories, sensors, lights, indicators, displays or the like which may be suitable for mounting or positioning at or within the rearview mirror assembly.

The accessories or components of the rearview mirror assembly may be connected to the vehicle electronic or communication systems and may be connected via various protocols or nodes, such as Bluetooth, SCP, UBP, J1850, CAN J2284, Fire Wire 1394, MOST, LIN and/or the like, depending on the particular application of the rearview mirror assembly of the present invention. The rearview mirror assembly may be electronically integrated with the vehicle electrical and/or control systems. For example, the rearview mirror assembly may connect to a sunroof control, rain sensor control, mass motion sensor, roof lighting control, microphone/cell phone control, climate control, and/or the like.

Therefore, the rearview mirror assembly and mirror reflective element assembly of the present invention provides a mirror reflective element assembly that includes the conductive trace and electronic components or circuitry applied directly to or integrated with the rear surface of the reflective element substrate of the mirror reflective element assembly or cell. The present invention thus provides a circuitry on glass arrangement and thus obviates the need for a separate rigid board or substrate for receiving circuitry thereon, and also obviates the need for an attachment plate and associated connectors for attaching such a printed circuit board to the rear of the reflective element assembly or cell. The present invention thus provides a compact and lightweight mirror reflective element assembly that provides enhanced assembly processing and minimizes electrical wiring and connections that may have to be made to connect the circuitry to various components or accessories associated with the mirror reflective element assembly.

Changes and modifications in the specifically described embodiments may be carried out without departing from the principles of the present invention, which is intended to be limited only by the scope of the appended claims as interpreted according to the principles of patent law.

The invention claimed is:

1. A rearview mirror assembly for a vehicle, said rearview mirror assembly comprising:

an electrochromic reflective element comprising a front glass substrate and a rear glass substrate having an electrochromic medium sandwiched therebetween;

wherein said front glass substrate has a first surface and a second surface and said rear glass substrate has a third surface and a fourth surface;

wherein said first surface of said front glass substrate faces generally towards a driver of a vehicle equipped with said rearview mirror assembly when said rearview mirror assembly is normally mounted and is viewed by the driver when normally operating the vehicle;

wherein said second surface is opposite said first surface and faces said electrochromic medium;

wherein said third surface faces said electrochromic medium and said fourth surface is opposite said third surface;

wherein said reflective element comprises (a) a transparent electrically conductive coating disposed at said second surface of said front glass substrate and (b) a mirror reflector disposed at said third surface of said rear glass substrate;

wherein said electrochromic medium contacts said transparent electrically conductive coating and said mirror reflector;

a conductive trace established on said fourth surface of said rear glass substrate, wherein said conductive trace comprises a trace of electrically conductive epoxy;

an electrical connector establishing electrical conductivity between said conductive trace and one of (i) said transparent electrically conductive coating disposed at said second surface of said front glass substrate and (ii) said mirror reflector disposed at said third surface of said rear glass substrate; and wherein said electrical connector connects to said conductive trace via a solderless connection.

2. The rearview mirror assembly of claim 1, wherein said conductive trace comprises an electrically conductive rail disposed at least a portion of a perimeter region of said fourth surface of said rear glass substrate, and wherein said electrical connector is connected between said electrically conductive rail and one of (i) a perimeter portion of said transparent electrically conductive coating disposed at said second surface of said front glass substrate and (ii) a perimeter portion of said mirror reflector disposed at said third surface of said rear glass substrate.

3. The rearview mirror assembly of claim 2, wherein said electrical connector is connected between said electrically conductive rail and a perimeter portion of said transparent electrically conductive coating disposed at said second surface of said front glass substrate, and wherein a second electrical connector is connected between another electrically conductive rail disposed at another portion of said perimeter region of said fourth surface of said rear glass substrate and a perimeter portion of said mirror reflector disposed at said third surface of said rear glass substrate.

4. The rearview mirror assembly of claim 1, wherein said electrical connector comprises a clip that clips onto an edge portion of one of (a) said front substrate and (b) said rear substrate to establish electrical conductivity between said conductive trace and one of (i) said transparent electrically conductive coating disposed at said second surface of said front glass substrate and (ii) said mirror reflector disposed at said third surface of said rear glass substrate.

5. The rearview mirror assembly of claim 1, wherein an electrically conductive layer is disposed at a portion of said fourth surface of said rear glass substrate and a non-conductive layer is applied at said electrically conductive layer and covering at least a portion of said electrically conductive layer and leaving at least one portion of said electrically conductive layer exposed, and wherein said at least one exposed portion of said electrically conductive layer comprises said conductive trace at said fourth surface of said rear glass substrate.

6. The rearview mirror assembly of claim 1, wherein said conductive trace comprises an electrically conductive resin.

7. The rearview mirror assembly of claim 1, wherein said conductive trace comprises an electrically conductive silver epoxy.

8. The rearview mirror assembly of claim 1, wherein at least one electronic circuitry component is directly attached at said fourth surface of said rear glass substrate.

9. The rearview mirror assembly of claim 8, wherein said at least one electronic circuitry component comprises a carbon ink resistor.

10. The rearview mirror assembly of claim 8, wherein said at least one electronic circuitry component comprises at least one proximity sensor positioned along a portion of said rear surface of said rear glass substrate, said at least one proximity sensor being operable to detect a presence of a person's finger at or near said mirror assembly.

11. The rearview mirror assembly of claim 1, wherein said conductive trace comprises a layer of resin material disposed at said fourth surface of said rear glass substrate, and wherein, when said resin material is in an uncured state at said fourth surface of said rear glass substrate, said electrical connector contacts said uncured resin material at said fourth surface of said rear glass substrate, and wherein said solderless electrical connection is established when said resin material cures to form said conductive trace.

12. The rearview mirror assembly of claim 11, wherein said resin material comprises a conductive silver epoxy.

13. The rearview mirror assembly of claim 1, wherein said rearview mirror assembly comprises an interior rearview mirror assembly mounted at an interior portion of a vehicle equipped with said rearview mirror assembly.

14. A rearview mirror assembly for a vehicle, said rearview mirror assembly comprising:
  an electrochromic reflective element comprising a front glass substrate and a rear glass substrate having an electrochromic medium sandwiched therebetween;
  wherein said front glass substrate has a first surface and a second surface and said rear glass substrate has a third surface and a fourth surface;
  wherein said rearview mirror assembly comprises an interior rearview mirror assembly mounted at an interior portion of a vehicle equipped with said rearview mirror assembly;
  wherein said first surface of said front glass substrate faces generally towards a driver of a vehicle equipped with said rearview mirror assembly when said rearview mirror assembly is normally mounted and is viewed by the driver when normally operating the vehicle;
  wherein said second surface is opposite said first surface and faces said electrochromic medium;
  wherein said third surface faces said electrochromic medium and said fourth surface is opposite said third surface;
  wherein said reflective element comprises (a) a transparent electrically conductive coating disposed at said second surface of said front glass substrate and (b) a mirror reflector disposed at said third surface of said rear glass substrate;
  wherein said electrochromic medium contacts said transparent electrically conductive coating and said mirror reflector;
  a conductive trace established on said fourth surface of said rear glass substrate, wherein said conductive trace comprises an electrically conductive silver epoxy;
  an electrical connector establishing electrical conductivity between said conductive trace and one of (i) said transparent electrically conductive coating disposed at said second surface of said front glass substrate and (ii) said mirror reflector disposed at said third surface of said rear glass substrate; and
  wherein said electrical connector connects to said conductive trace via a solderless connection.

15. The rearview mirror assembly of claim 14, wherein said conductive trace comprises an electrically conductive rail disposed at least a portion of a perimeter region of said fourth surface of said rear glass substrate, and wherein said electrical connector is connected between said electrically conductive rail and one of (i) a perimeter portion of said transparent electrically conductive coating disposed at said second surface of said front glass substrate and (ii) a perimeter portion of said mirror reflector disposed at said third surface of said rear glass substrate.

16. The rearview mirror assembly of claim 14, wherein said conductive trace comprises a layer of resin material disposed at said fourth surface of said rear glass substrate, and wherein, when said resin material is in an uncured state at said fourth surface of said rear glass substrate, said electrical connector contacts said uncured resin material at said fourth surface of said rear glass substrate, and wherein said solderless electrical connection is established when said resin material cures to form said conductive trace.

17. A rearview mirror assembly for a vehicle, said rearview mirror assembly comprising:
  an electrochromic reflective element comprising a front glass substrate and a rear glass substrate having an electrochromic medium sandwiched therebetween;
  wherein said front glass substrate has a first surface and a second surface and said rear glass substrate has a third surface and a fourth surface;
  wherein said rearview mirror assembly comprises an interior rearview mirror assembly mounted at an interior portion of a vehicle equipped with said rearview mirror assembly;
  wherein said first surface of said front glass substrate faces generally towards a driver of a vehicle equipped with said rearview mirror assembly when said rearview mirror assembly is normally mounted and is viewed by the driver when normally operating the vehicle;
  wherein said reflective element comprises (a) a transparent electrically conductive coating disposed at said second surface of said front glass substrate and (b) a mirror reflector disposed at said third surface of said rear glass substrate;
  wherein said electrochromic medium contacts said transparent electrically conductive coating and said mirror reflector;
  a conductive trace established on said fourth surface of said rear glass substrate, wherein said conductive trace comprises an electrically conductive silver epoxy;
  an electrical connector establishing electrical conductivity between said conductive trace and one of (i) said transparent electrically conductive coating disposed at said second surface of said front glass substrate and (ii) said mirror reflector disposed at said third surface of said rear glass substrate;
  wherein said electrical connector connects to said conductive trace via a solderless connection, wherein said conductive trace comprises an electrically conductive rail disposed at least a portion of a perimeter region of said fourth surface of said rear glass substrate, and wherein said electrical connector is connected between said electrically conductive rail and one of (i) a perimeter portion of said transparent electrically conductive coating disposed at said second surface of said front glass substrate and (ii) a perimeter portion of said mirror reflector disposed at said third surface of said rear glass substrate; and
  wherein said electrical connector is connected between said electrically conductive rail and a perimeter portion of said transparent electrically conductive coating disposed at said second surface of said front glass substrate, and wherein a second electrical connector is connected between another electrically conductive rail disposed at another portion of said perimeter region of said fourth surface of said rear glass substrate and a perimeter portion of said mirror reflector disposed at said third surface of said rear glass substrate.

18. A rearview mirror assembly for a vehicle, said rearview mirror assembly comprising:
an electrochromic reflective element comprising a front glass substrate and a rear glass substrate having an electrochromic medium sandwiched therebetween;
wherein said front glass substrate has a first surface and a second surface and said rear glass substrate has a third surface and a fourth surface;
wherein said rearview mirror assembly comprises an interior rearview mirror assembly mounted at an interior portion of a vehicle equipped with said rearview mirror assembly;
wherein said first surface of said front glass substrate faces generally towards a driver of a vehicle equipped with said rearview mirror assembly when said rearview mirror assembly is normally mounted and is viewed by the driver when normally operating the vehicle;
wherein said reflective element comprises (a) a transparent electrically conductive coating disposed at said second surface of said front glass substrate and (b) a mirror reflector disposed at said third surface of said rear glass substrate;
wherein said electrochromic medium contacts said transparent electrically conductive coating and said mirror reflector;
a conductive trace established on said fourth surface of said rear glass substrate, wherein said conductive trace comprises an electrically conductive silver epoxy;
an electrical connector establishing electrical conductivity between said conductive trace and one of (i) said transparent electrically conductive coating disposed at said second surface of said front glass substrate and (ii) said mirror reflector disposed at said third surface of said rear glass substrate; and
wherein said electrical connector connects to said conductive trace via a solderless connection, and wherein said electrical connector comprises a clip that clips onto an edge portion of one of (a) said front substrate and (b) said rear substrate to establish electrical conductivity between said conductive trace and one of (i) said transparent electrically conductive coating disposed at said second surface of said front glass substrate and (ii) said mirror reflector disposed at said third surface of said rear glass substrate.

19. A rearview mirror assembly for a vehicle, said rearview mirror assembly comprising:
an electrochromic reflective element comprising a front glass substrate and a rear glass substrate having an electrochromic medium sandwiched therebetween;
wherein said front glass substrate has a first surface and a second surface and said rear glass substrate has a third surface and a fourth surface;
wherein said rearview mirror assembly comprises an interior rearview mirror assembly mounted at an interior portion of a vehicle equipped with said rearview mirror assembly;
wherein said first surface of said front glass substrate faces generally towards a driver of a vehicle equipped with said rearview mirror assembly when said rearview mirror assembly is normally mounted and is viewed by the driver when normally operating the vehicle;
wherein said reflective element comprises (a) a transparent electrically conductive coating disposed at said second surface of said front glass substrate and (b) a mirror reflector disposed at said third surface of said rear glass substrate;
wherein said electrochromic medium contacts said transparent electrically conductive coating and said mirror reflector;
a conductive trace established on said fourth surface of said rear glass substrate, wherein said conductive trace comprises an electrically conductive silver epoxy;
an electrical connector establishing electrical conductivity between said conductive trace and one of (i) said transparent electrically conductive coating disposed at said second surface of said front glass substrate and (ii) said mirror reflector disposed at said third surface of said rear glass substrate; and
wherein said electrical connector connects to said conductive trace via a solderless connection, and wherein at least one electronic circuitry component is directly attached at said fourth surface of said rear glass substrate.

20. A rearview mirror assembly for a vehicle, said rearview mirror assembly comprising:
an electrochromic reflective element comprising a front glass substrate and a rear glass substrate having an electrochromic medium sandwiched therebetween;
wherein said front glass substrate has a first surface and a second surface and said rear glass substrate has a third surface and a fourth surface;
wherein said rearview mirror assembly comprises an interior rearview mirror assembly mounted at an interior portion of a vehicle equipped with said rearview mirror assembly;
wherein said first surface of said front glass substrate faces generally towards a driver of a vehicle equipped with said rearview mirror assembly when said rearview mirror assembly is normally mounted and is viewed by the driver when normally operating the vehicle;
wherein said second surface is opposite said first surface and faces said electrochromic medium;
wherein said third surface faces said electrochromic medium and said fourth surface is opposite said third surface;
wherein said reflective element comprises (a) a transparent electrically conductive coating disposed at said second surface of said front glass substrate and (b) a mirror reflector disposed at said third surface of said rear glass substrate;
wherein said electrochromic medium contacts said transparent electrically conductive coating and said mirror reflector;
a conductive trace established on said fourth surface of said rear glass substrate, wherein said conductive trace comprises a layer of resin material disposed at said fourth surface of said rear glass substrate, and wherein said resin material comprises an electrically conductive silver epoxy;
wherein said conductive trace comprises an electrically conductive rail disposed at least a portion of a perimeter region of said fourth surface of said rear glass substrate;
an electrical connector establishing electrical conductivity between said electrically conductive rail and one of (i) said transparent electrically conductive coating disposed at said second surface of said front glass substrate and (ii) said mirror reflector disposed at said third surface of said rear glass substrate; and
wherein said electrical connector connects to said conductive trace via a solderless connection, and wherein, when said resin material is in an uncured state at said fourth surface of said rear glass substrate, said electrical connector contacts said uncured resin material at said fourth surface of said rear glass substrate, and wherein said solderless electrical connection is established when said resin material cures to form said conductive trace.

21. A rearview mirror assembly for a vehicle, said rearview mirror assembly comprising:

an electrochromic reflective element comprising a front glass substrate and a rear glass substrate having an electrochromic medium sandwiched therebetween;

wherein said front glass substrate has a first surface and a second surface and said rear glass substrate has a third surface and a fourth surface;

wherein said rearview mirror assembly comprises an interior rearview mirror assembly mounted at an interior portion of a vehicle equipped with said rearview mirror assembly;

wherein said first surface of said front glass substrate faces generally towards a driver of a vehicle equipped with said rearview mirror assembly when said rearview mirror assembly is normally mounted and is viewed by the driver when normally operating the vehicle;

wherein said reflective element comprises (a) a transparent electrically conductive coating disposed at said second surface of said front glass substrate and (b) a mirror reflector disposed at said third surface of said rear glass substrate;

wherein said electrochromic medium contacts said transparent electrically conductive coating and said mirror reflector;

a conductive trace established on said fourth surface of said rear glass substrate, wherein said conductive trace comprises a layer of resin material disposed at said fourth surface of said rear glass substrate, and wherein said resin material comprises an electrically conductive silver epoxy;

wherein said conductive trace comprises an electrically conductive rail disposed at least a portion of a perimeter region of said fourth surface of said rear glass substrate;

an electrical connector establishing electrical conductivity between said electrically conductive rail and one of (i) said transparent electrically conductive coating disposed at said second surface of said front glass substrate and (ii) said mirror reflector disposed at said third surface of said rear glass substrate;

wherein said electrical connector connects to said conductive trace via a solderless connection, and wherein, when said resin material is in an uncured state at said fourth surface of said rear glass substrate, said electrical connector contacts said uncured resin material at said fourth surface of said rear glass substrate, and wherein said solderless electrical connection is established when said resin material cures to form said conductive trace; and wherein said electrical connector comprises a clip that clips onto an edge portion of one of (a) said front substrate and (b) said rear substrate to establish electrical conductivity between said conductive trace and one of (i) said transparent electrically conductive coating disposed at said second surface of said front glass substrate and (ii) said mirror reflector disposed at said third surface of said rear glass substrate.

* * * * *

UNITED STATES PATENT AND TRADEMARK OFFICE
CERTIFICATE OF CORRECTION

PATENT NO. : 7,898,719 B2  
APPLICATION NO. : 12/580499  
DATED : March 1, 2011  
INVENTOR(S) : Kenneth Schofield, David C. Wight and Mark E. Kramer It is certified that error appears in the above-identified patent and that said Letters Patent is hereby corrected as shown below:

Column 5
Line 16, "tie" should be --the--

Column 10
Line 48, "CONDUCTING" should be --CONDUITING--

Column 18
Line 22, Claim 2, Insert --at-- after "at"

Column 19
Line 65, Claim 15, Insert --at-- after "at"

Column 20
Line 52, Claim 17, Insert --at-- after "at"

Column 22
Line 58, Claim 20, Insert --at-- after "at"

Column 24
Line 8, Claim 21, Insert --at-- after "at"

Signed and Sealed this
Eighth Day of November, 2011

David J. Kappos
*Director of the United States Patent and Trademark Office*